(12) United States Patent
Kanazawa

(10) Patent No.: US 8,074,192 B2
(45) Date of Patent: *Dec. 6, 2011

(54) VERIFICATION SUPPORT APPARATUS, VERIFICATION SUPPORT METHOD, AND COMPUTER PRODUCT

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 269 days.

This patent is subject to a terminal disclaimer.

(21) Appl. No.: 12/405,373

(22) Filed: Mar. 17, 2009

(65) Prior Publication Data

US 2009/0234620 A1  Sep. 17, 2009

(30) Foreign Application Priority Data

Mar. 17, 2008 (JP) .................................. 2008-068049

(51) Int. Cl.
  *G06F 17/50* (2006.01)
(52) U.S. Cl. ........... 716/103; 716/107; 716/111; 703/16
(58) Field of Classification Search .................. 716/103, 716/107, 111; 703/16
See application file for complete search history.

(56) References Cited

U.S. PATENT DOCUMENTS 7,966,590 B2 * 6/2011 Kanazawa et al. ............ 716/104
2008/0312881 A1 * 12/2008 Kanazawa et al. ................ 703/1

FOREIGN PATENT DOCUMENTS

JP  2000-215226  8/2000
JP  2008-250644  10/2008

OTHER PUBLICATIONS

U.S. Appl. No. 12/076,551, Yuzi Kanazawa et al.

* cited by examiner

*Primary Examiner* — Phallaka Kik
(74) *Attorney, Agent, or Firm* — Fujitsu Patent Center

(57) ABSTRACT

The circuit volume of a system under design is reduced by a circuit conversion involving consolidation (sharing) of common parts in the system by a representative part. The design data of the system post-conversion is used to verify operation of the system. However, the verification results for the system post-conversion express signals (e.g., signal X) of plural modules (e.g., modules a to c) as one signal waveform thereby making debugging difficult when a bug is found. Given this situation, from the verification results of the system post-conversion, signal-generation-use data is generated for generating the signal waveforms (here, respective signal waveforms for the modules a to c) of the system before conversion. After verification is complete, a signal waveform for each of the modules a to c is generated using the verification results for the system under design and the signal-generation-use data.

11 Claims, 25 Drawing Sheets

FIG.5

| NAME | CATEGORY | TYPE | MODULE/CELL |
|---|---|---|---|
| module_cpu_a | CPU | ⋮ | CPU |
| module_cpu_b | CPU | ⋮ | CPU |
| ⋮ | ⋮ | ⋮ | ⋮ |
| sell_ff_x | SEQUEN-TIAL CIRCUIT | ⋮ | D Q |
| sell_ff_y | SEQUEN-TIAL CIRCUIT | ⋮ | D Q |
| ⋮ | ⋮ | ⋮ | ⋮ |
| sell_ram_z | SEQUEN-TIAL CIRCUIT | ⋮ | RAM |
| ⋮ | ⋮ | ⋮ | ⋮ |

LIBRARY 500

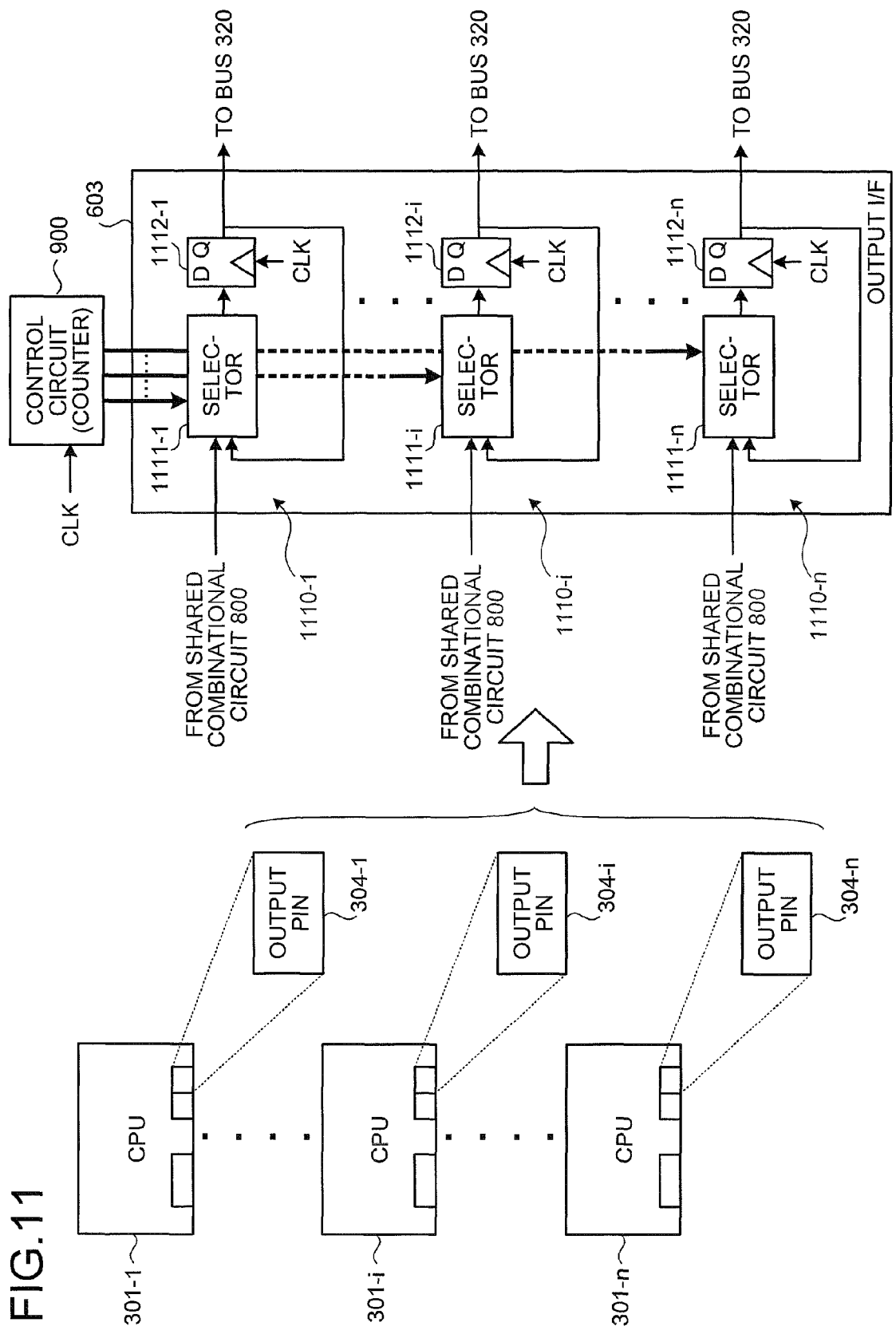

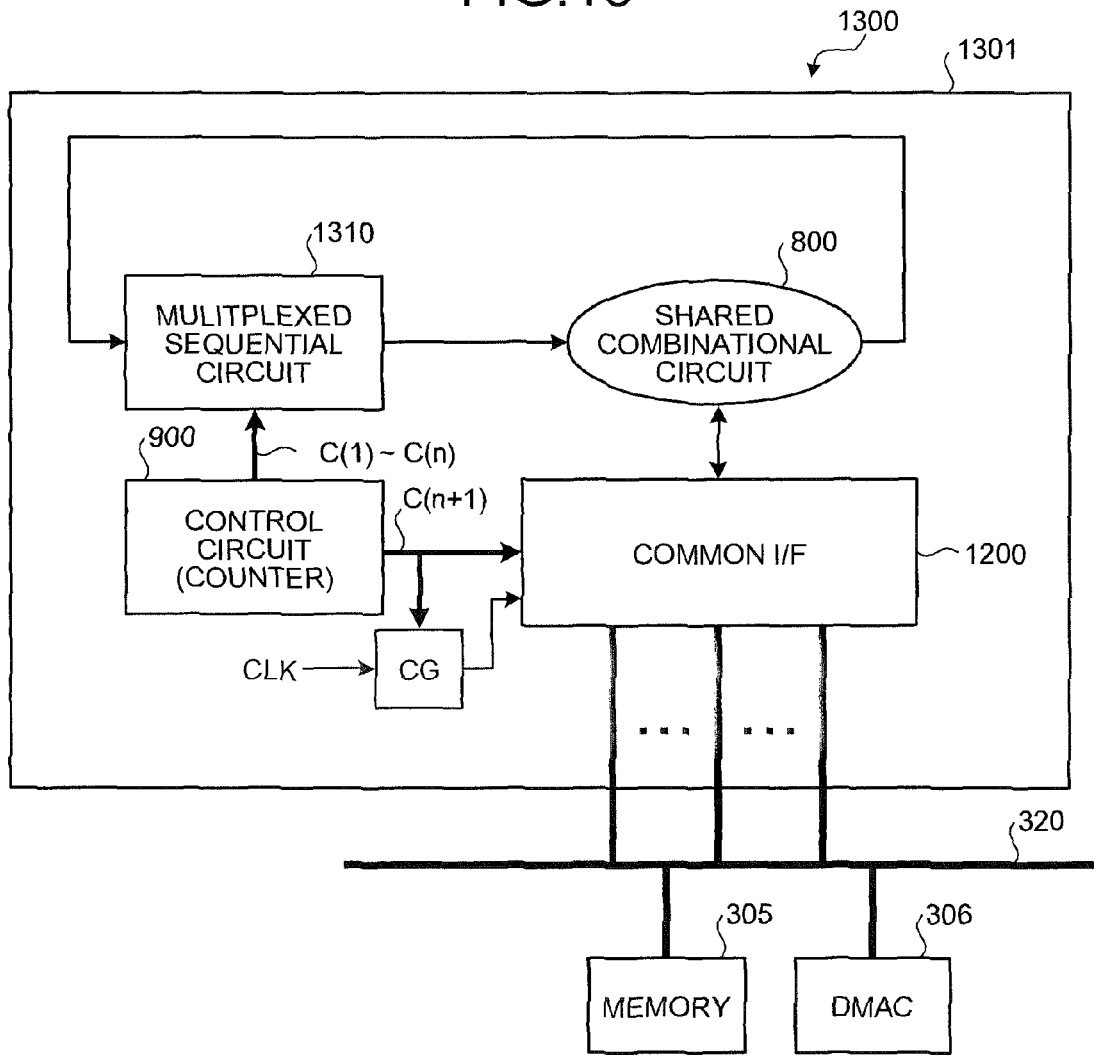

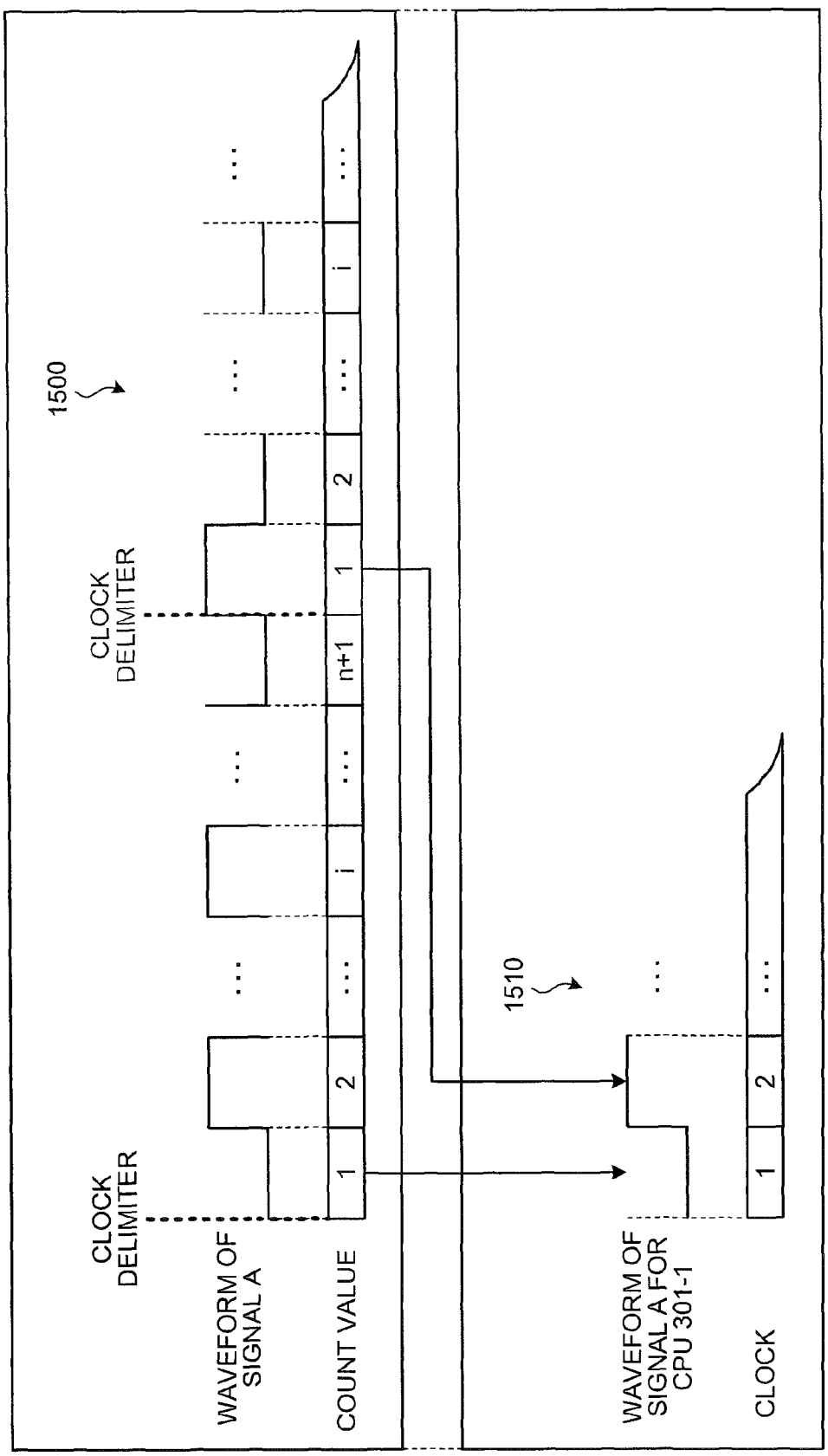

| COUNT VALUE | NAME OF MODULE1 | NAME OF MODULE2 |
|---|---|---|
| 1 | CPU301a-1 | CPU301b-1 |
| 2 | CPU301a-2 | CPU301b-2 |
| ⋮ | ⋮ | ⋮ |
| m | CPU301a-m | CPU301b-m |
| ⋮ | ⋮ | |
| n | CPU301a-n | |

| COUNT VALUE | NAME OF MODULE |
|---|---|
| 1 | CPU301-1-1 |
| 2 | CPU301-1-2 |
| ⋮ | ⋮ |
| (n+1) × K | CPU301-K-n |

| CLOCK | NAME OF FF | OUTPUT VALUE |
|---|---|---|
| 1 | FF421-1 | Q1-1 |
| | ⋮ | ⋮ |
| | FF421-i | Q1-i |
| | ⋮ | ⋮ |
| | FF421-n | Q1-n |
| 2 | FF421-1 | Q2-1 |
| | ⋮ | ⋮ |
| ⋮ | ⋮ | ⋮ |
| f | FF421-1 | Qf-1 |
| | ⋮ | ⋮ |

VERIFICATION SUPPORT APPARATUS, VERIFICATION SUPPORT METHOD, AND COMPUTER PRODUCT

CROSS-REFERENCE TO RELATED APPLICATIONS

This application is based upon and claims the benefit of priority from the prior Japanese Patent Application No. 2008-068049, filed on Mar. 17, 2008, the entire contents of which are incorporated herein by reference.

BACKGROUND OF THE INVENTION

1. Field of the Invention

The present invention relates to verification of large-scale integrated circuits under design.

2. Description of the Related Art

At the design stage of large-scale integration (LSI), simulation is used to verify whether a circuit will operate as desired. For simulations implemented by software, the larger the scale of the circuit, the more time is required for the simulation. Therefore, techniques involving the mounting of an LSI circuit under design on a field programmable gate array (FPGA) or other such hardware are used to execute the simulation.

Japanese Patent Application Laid-Open Publication No. 2000-215226 discloses a technology involving the use of a software simulator and a hardware simulator to perform circuit verification. Specifically, logical information is read from a recording medium, where a portion of the logical information that is determinate to a configuration level is verified by the hardware simulator, while other portions are verified by the software simulator.

Although simulation employing an FPGA is faster than simulation via software, there are limitations to the scale of the circuit that can be simulated. In particular, when the operation of a system having multiprocessor architecture for increased processing speed is verified, a problem arises in that the scale of the circuit integrating the multiple cores becomes too large to fully mount on the FPGA.

For example, in a system having multiprocessor architecture, identical central processing units (CPU) operate communicating through a bus. Conventionally, when a system having n CPUs connected is to be simulated, the circuit volume becomes n times as great. Thus, a problem arises in that simulations of larger scale circuits become dependent upon software, thereby inviting prolonged design periods.

On the other hand, when operation is confirmed for portions other than actual processors, the use of pseudo processors having reduced circuit volumes may prevent such problems concerning LSI circuits such as systems having multiprocessor architecture.

However, a problem of reduced design accuracy arises as the simulated operation may not coincide with the actual operation causing omissions to occur. Further, as the pseudo processors have to be created, which requires time and labor, in the end, the problem of a prolonged design period arises.

SUMMARY OF THE INVENTION

It is an object of the present invention to at least solve the above problems in the conventional technologies.

A computer-readable recording medium according to one aspect of the present invention stores therein a verification support program that causes a computer to execute: receiving input of design data concerning a system under design having a multiplex module that is a plurality of modules of an identical category and type operating in parallel; substituting, based on the design data, a multiplexed circuit for a plurality of sequential circuits in the modules, the multiplexed circuit being formed by a group of sequential circuit elements that are common among the sequential circuits and are multiplexed; creating a control circuit that time-division operates the group of common sequential circuit elements multiplexed by substitution of the sequential circuits at the substituting; building, based on the design data, a single module that includes one combinational circuit selected from among a plurality of combinational circuits of the modules, the multiplexed circuit, and the control circuit; generating information correlating timing of time-division operation of the group of sequential circuit elements with the modules having the sequential circuit elements operated at respective timings; and outputting the information generated at the generating and design data of the system inclusive of the single module.

A verification support apparatus according to one aspect of the present invention includes: a receiving unit configured to receive input of design data concerning a system under design having a multiplex module that is a plurality of modules of an identical category and type operating in parallel; a substituting unit configured to substitute, based on the design data, a multiplexed circuit for a plurality of sequential circuits in the modules, the multiplexed circuit being formed by a group of sequential circuit elements that are common among the sequential circuits and are multiplexed; a creating unit configured to create a control circuit that time-division operates the group of common sequential circuit elements multiplexed by substitution of the sequential circuits at the substituting; a building unit configured to build, based on the design data, a single module that includes one combinational circuit selected from among a plurality of combinational circuits of the modules, the multiplexed circuit, and the control circuit; generating information correlating timing of time-division operation of the group of sequential circuit elements with the modules having the sequential circuit elements operated at respective timings; and an outputting unit configured to output the information generated at the generating and design data of the system inclusive of the single module.

A method of verification support according to one aspect of the present invention includes: receiving input of design data concerning a system under design having a multiplex module that is a plurality of modules of an identical category and type operating in parallel; substituting, based on the design data, a multiplexed circuit for a plurality of sequential circuits in the modules, the multiplexed circuit being formed by a group of sequential circuit elements that are common among the sequential circuits and are multiplexed; creating a control circuit that time-division operates the group of common sequential circuit elements multiplexed by substitution of the sequential circuits at the substituting; building, based on the design data, a single module that includes one combinational circuit selected from among a plurality of combinational circuits of the modules, the multiplexed circuit, and the control circuit; generating information correlating timing of time-division operation of the group of sequential circuit elements with the modules having the sequential circuit elements operated at respective timings; and outputting the information generated at the generating and design data of the system inclusive of the single module.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a schematic of the contents of a library;
FIG. 11 is a schematic of an example of the substitution of an output pin;
FIG. 13 is a schematic of a single module built by the building unit;
FIG. 14 is one example of a correlation table generated by the generating unit;
FIG. 15 is a schematic outlining extraction processing performed by the extraction unit;
FIG. 20 is schematic of another example of the correlation table generated by the generating unit;
FIG. 23 is a schematic of another example of the correlation table generated by the generating unit.

DETAILED DESCRIPTION OF THE PREFERRED EMBODIMENTS

Referring to the accompanying drawings, exemplary embodiments according to the present invention are explained in detail below.

According to an aspect of an embodiment, the circuit scale of a large-scale system under design is reduced enabling simulation by hardware. Further, as waveforms of each signal of the system under design before conversion can be referred to as verification results, debugging work can be performed more efficiently.

Figure 1:
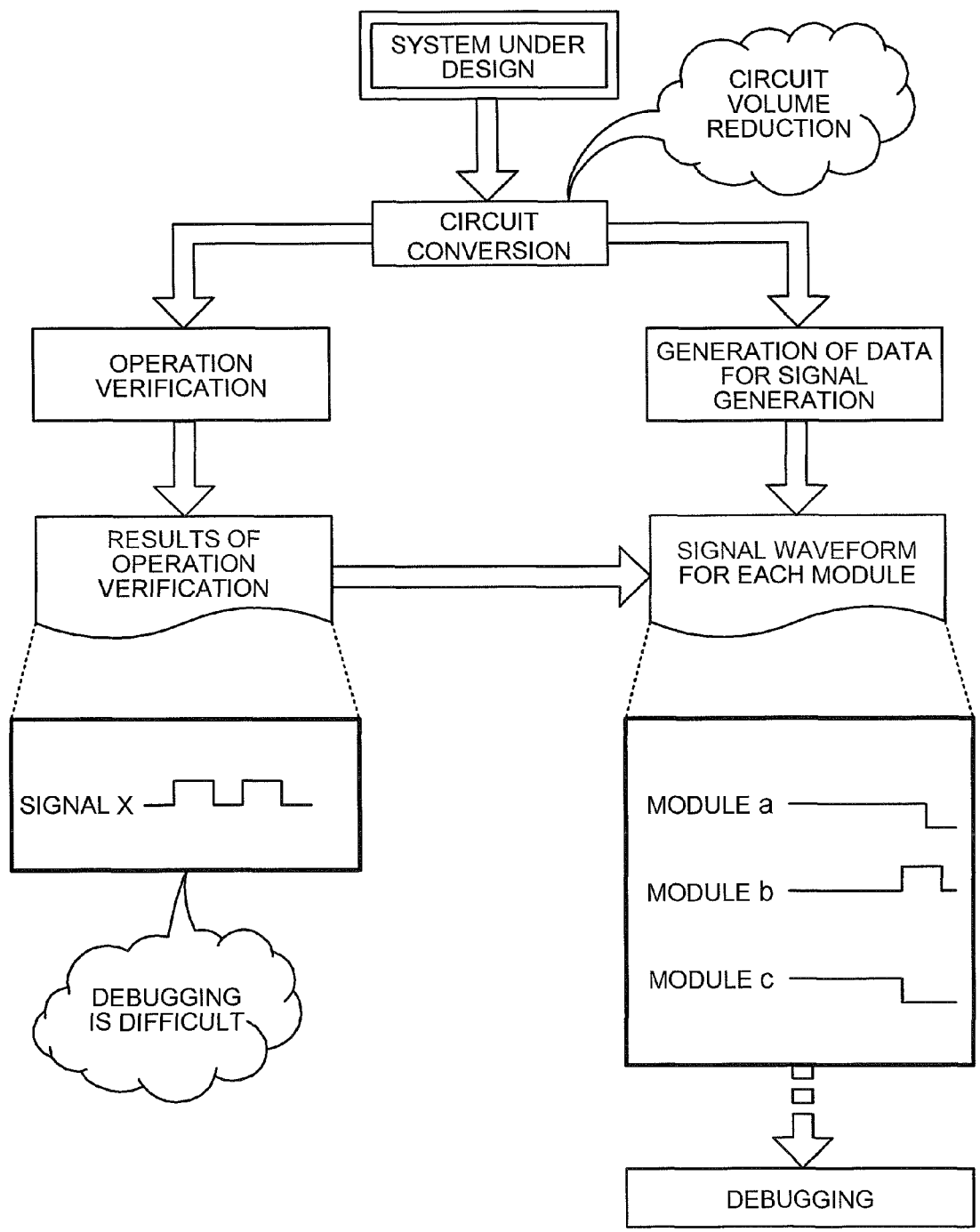
FIG. 1 is a diagram summarizing a first embodiment.

FIG. 1 is a diagram summarizing a first embodiment. As depicted in FIG. 1, the circuit volume of a system under design is reduced by a circuit conversion involving consolidation (sharing) of common parts in the system by a representative part. The design data of the system post-conversion is used to verify operation of the system.

Here, through the reduction of the circuit volume by the conversion, even a large-scale system under design can be mounted on hardware such an FPGA, thereby enabling reduction of the design period. On the contrary, verification results for the system post-conversion express signals (here, signal X) of the plural modules (here, modules a to c) as one signal waveform thereby making debugging difficult when a bug is found.

Given this situation, from the verification results of the system post-conversion, signal-generation-use data is generated for generating the signal waveforms (here, respective signal waveforms for the modules a to c) of the system before conversion. After verification is complete, a signal waveform for each of the modules a to c is generated using the verification results for the system under design and the signal-generation-use data. Provision of the signal waveform for each of the modules a to c as a verification result facilitates greater efficiency in the debugging work performed by the user.

Figure 2:
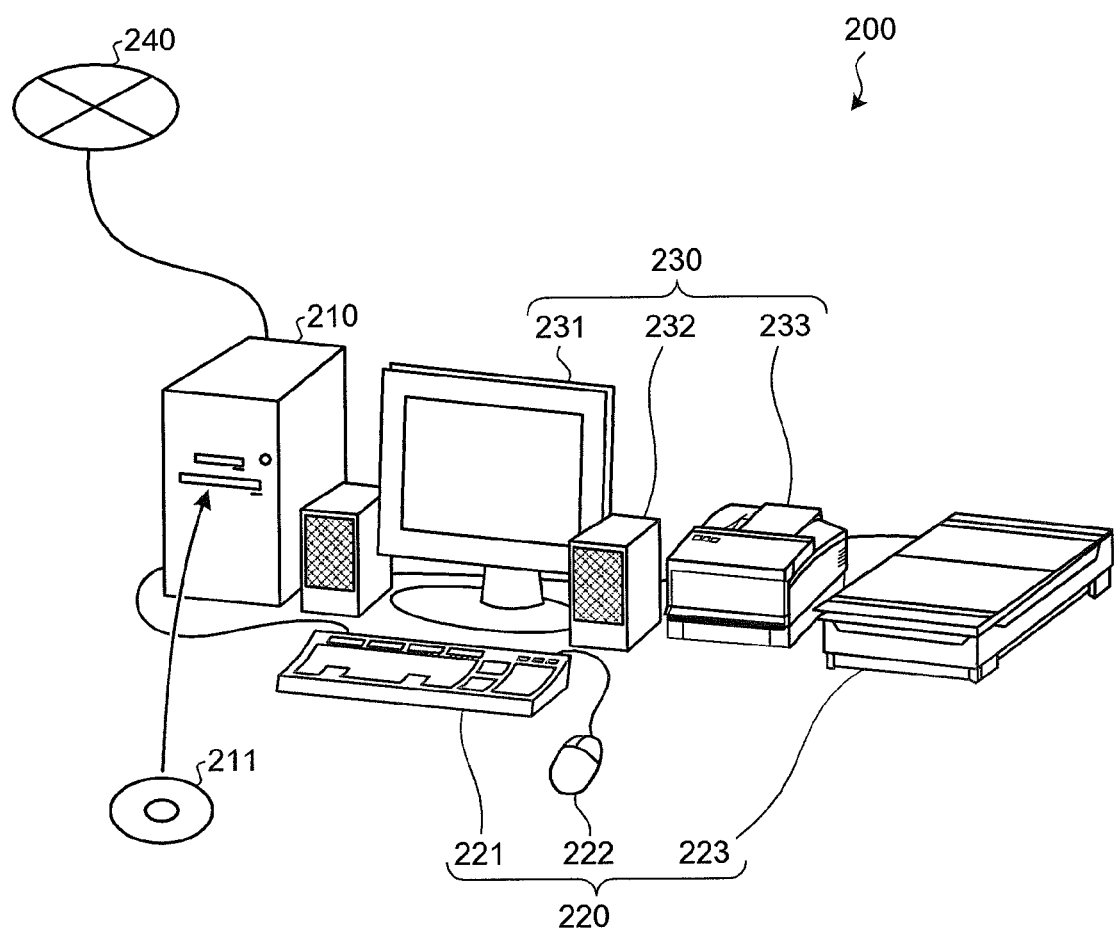
FIG. 2 is a block diagram of a verification support apparatus according to the first embodiment.

FIG. 2 is a block diagram of a verification support apparatus according to the first embodiment of the present invention. As depicted in FIG. 2, a verification support apparatus 200 includes a computer 210, input apparatus 220, and output apparatus 230, and can be connected with a network 240, e.g., a local area network (LAN), a wide area network (WAN), or the Internet through a non-depicted router or a modem.

The computer 210 includes a central processing unit (CPU), a main memory, and an interface. The CPU controls the entire verification support apparatus 200. For the main memory, a random access memory (RAM), etc. is used. As an auxiliary memory apparatus, a HDD (hard disk drive), an optical disk 211, flash memory and the like is provided. However, such apparatuses do not necessarily have to be provided in the computer 210. The main memory is used as a work area for the CPU.

In the HDD, various programs are stored and loaded to the main memory in response to a command from the CPU. The reading/writing of data from/onto the optical disk 211 is controlled by an optical disk drive. The interface controls input from the input apparatus 220, output to the output apparatus 230, and transmission/reception with respect to the network 240.

The input apparatus 220 includes a keyboard 221, a mouse 222, and a scanner 223. The keyboard 221 includes keys to input, for example, characters, numeric figures, and various kinds of instructions, and data is input through the keyboard 221. The keyboard 221 may be of a touch panel type. The mouse 222 is used to move a cursor, select a range, move a window, or change a window size. The scanner 223 optically reads an image. The image read is stored in the memory of the computer 210 as image data. The scanner 223 may have an optical character recognition (OCR) function.

The output apparatus 230 includes a display 231, a speaker 232, and a printer 233, etc. The display 231 displays a cursor, an icon, or a tool box as well as data, such as text, an image, and function information. The speaker 232 outputs sound, e.g., a sound effect or a text-to-voice converted sound. The printer 233 prints image data and text data.

One example of a system under design according to the first embodiment of the present invention is described. The system includes modules (CPU, memory, direct memory access controller (DMAC), etc.) of an identical category and type.

In the first embodiment, plural modules are referred to as a multiplex module. The first embodiment hereinafter describes, as an example of a system including a multiplex module, a multiprocessor system which includes plural CPUs of an identical category and type operating in parallel.

Figure 3:
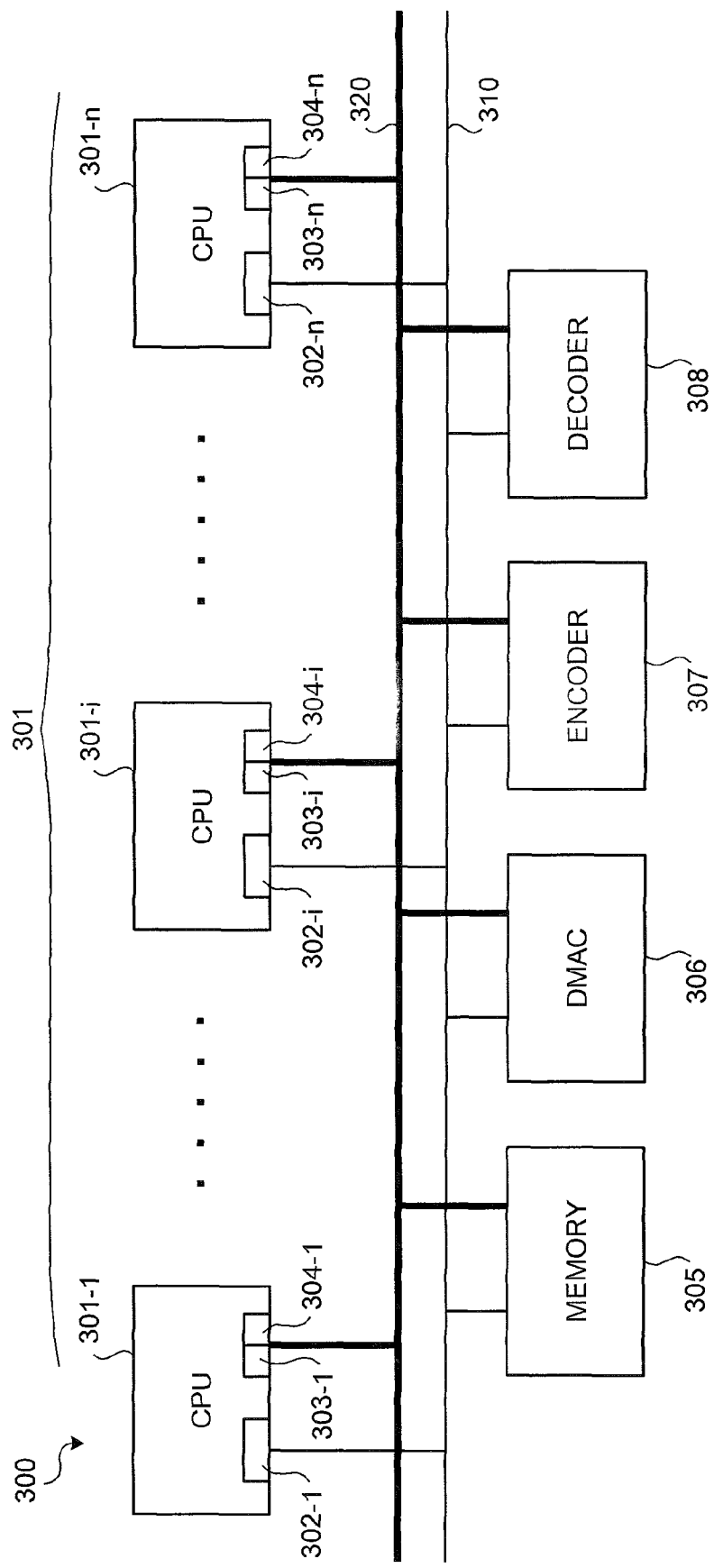
FIG. 3 is a schematic of an example of a system under design.

FIG. 3 is a schematic of an example of a system under design. As depicted in FIG. 3, a system under design 300 is a multiprocessor system in which a multiplex module 301 including n (n 1, 2, . . . ) CPUs 301-1, . . . , 301-i, . . . , 301-n is mounted.

A CPU 301-i includes a clock terminal 302-i connected to a clock line 310, and an input pin I/F 303-i and an output pin 304-i that are connected to a bus 320. For example, various modules such as a memory 305, a direct memory access controller (DMAC) 306, an encoder 307, and a decoder 308 are connected to the bus 320 in the system under design 300.

Figure 4:
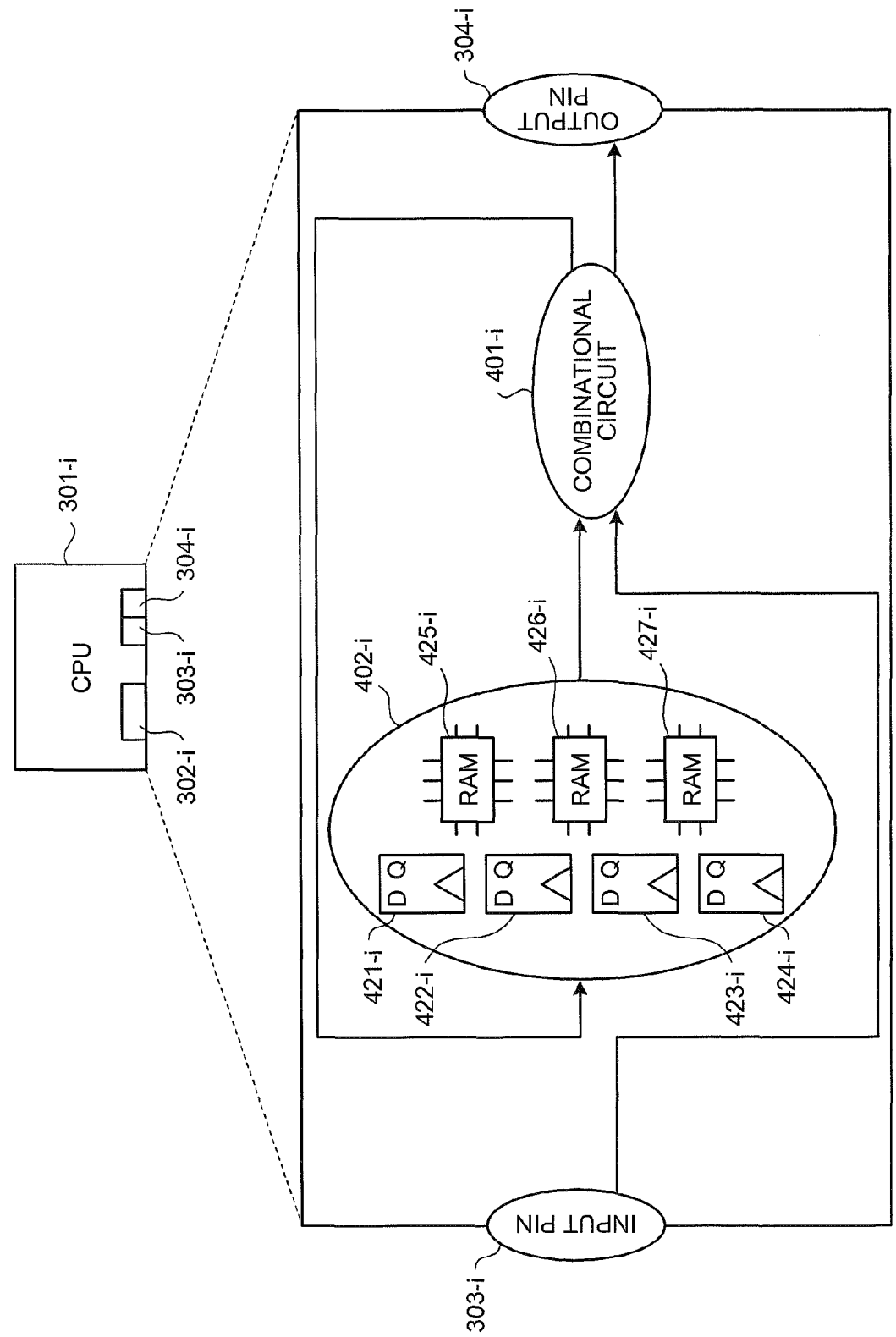
FIG. 4 is a schematic of an internal circuit configuration of an arbitrary CPU in the multiplex module.

FIG. 4 is a schematic of an internal circuit configuration of an arbitrary CPU 301-i in the multiplex module 301 depicted in FIG. 3. As depicted in FIG. 4, the CPU 301-i includes a combinational circuit 401-i, a sequential circuit 402-i, the input pin 303-i, and the output pin 304-i.

The combinational circuit 401-i receives data from the input pin 303-i or the sequential circuit 402-i and outputs the data to the sequential circuit 402-i or the output pin 304-i. The combinational circuit 401-i has a configuration identical to that of combinational circuits 401-1 to 401-(i1) and 401-(i1) to 401-n of other CPUs 301-1 to 301-(i1) and 301-(i1) to 301-n, respectively. The combinational circuit 401-i is a circuit equivalent to, for example, a sequencer of the CPU 301-i.

The sequential circuit 402-i includes an enormous number of sequential circuit elements that are connected, such as flip-flops (FF) and RAM. For simplicity, the schematic of FIG. 4 depicts sequential circuit elements such as FF 421-i to 424-i and RAM 425-i to 427-i. Although the sequential circuit 402-i has a configuration identical to that of the sequential circuits 402-1 to 402-(i1) and 402-(i+1) to 402-n of other CPUs 301-1 to 301-(i−1) and 301-(i+1) to 301-n, a different value is retained therein for each CPU 310-i. The sequential circuit 402-i is comparable to a register of the CPU 301-i.

The input pin 303-i receives data from the bus 320 and outputs the data to the combinational circuit 401-i. The output pin 304-i outputs data acquired from the combinational circuit 401-i to the bus 320.

FIG. 5 is a schematic of the contents of a library employed by the verification support apparatus 200. As depicted in FIG. 5 various circuit data (modules and cells), categorized by name, category, and type, are stored in a library 500.

The name uniquely specifies modules and cells and corresponds to, for example, an actual product name or a model number. The category represents a category (CPU, sequential circuit, etc.) to which a module/cell belongs. The type is categorized within a category. For example, within the category of CPU, the CPUs are categorized according to type based on, for example, manufacturer and/or clock frequency. Within the category of sequential circuit, different types thereof are categorized, such as FF and RAM.

More specifically, if the categories of two modules within the system under design 300 are different, e.g., CPU and FF, the modules are not recognized as being identical. In the same manner, "module_cpu_a" and "module_cpu_b" within the same category of CPU are not recognized as being identical if the CPUs are of different types. The CPUs 301-1 to 301-n of the system under design 300 depicted in FIG. 3 are modules of an identical category and an identical type, e.g., "module_cpu_a".

The library 500 is implemented by a memory unit such as the HDD, the optical disk 211, flash memory. The library 500 may be mounted on the verification support apparatus 200 or on an external server communicable via a network.

Figure 6:
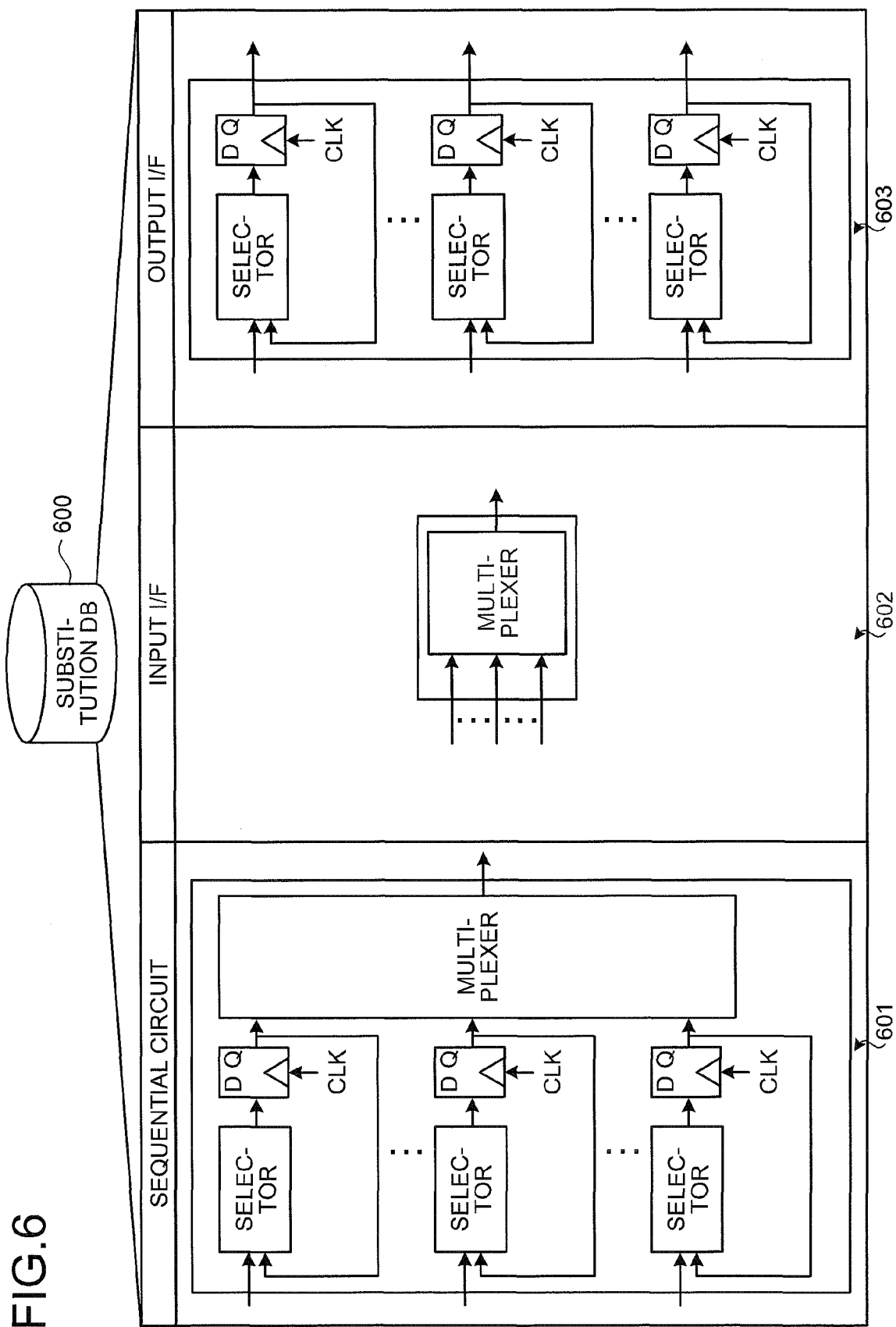
FIG. 6 is a schematic of the contents of a substitution DB.

FIG. 6 is a schematic of the contents of a substitution DB. As depicted in FIG. 6, a substitution DB 600 stores substitution modules 601 to 603 for a sequential circuit, an input I/F, and an output I/F. The substitution modules 601 to 603 are expressed by text data in hardware description language (HDL).

The substitution module 601 is a multiplexed circuit in which a group of sequential circuit elements (e.g., FF 421-1 to 421-n) common to the sequential circuits 402-1 to 402-n of the CPUs 301-1 to 301-n are multiplexed. The same is true for other groups of common sequential circuit elements (FF 422-1 to 422-n), . . . , (FF 424-1 to 424-n).

A group of common sequential circuit elements are of an identical category (FF, RAM) and further have identical connecting positions. Although FIG. 6 depicts only a multiplexed circuit for a group of sequential circuit elements (FF 421-1 to 421-n), . . . , (FF 424-1 to 424-n), a multiplexed circuit (not depicted) for a group of sequential circuit elements (RAM 425-1 to 425-n), . . . , (RAM 427-1 to 427-n) is stored as well.

The substitution module 601 expressing a multiplexed circuit satisfies a condition that output data from a sequential circuit element (e.g., FF 421-i) of the CPU 301-i is output from the output pin 304-i at an arbitrary state regardless of the circuit configuration thereof.

Thus, by substituting the substitution module 601 for a group of common sequential circuit elements (e.g., FF 421-1 to 421-n), common sequential circuit elements dispersed among the CPUs 301-1 to 301-n may be multiplexed into a single multiplexed circuit.

The substitution module 602 is an n-input/one-output type input I/F that selectively takes in data input to the CPUs 301-1 to 301-n. Thus, by substituting the substitution module 602, common input pins dispersed among the CPUs 301-1 to 301-n may be multiplexed into a single input I/F.

The substitution module 603 is an output I/F that selectively outputs data output from the combinational circuit 401-1 to 401-n of each of the CPUs 301-1 to 301-n. Thus, by substituting the substitution module 603, common output pins dispersed among the CPUs 301-1 to 301-n may be multiplexed into a single output I/F.

The substitution DB 600 is implemented by, for example, a memory unit such as the HDD, the optical disk 211, flash memory, etc. The substitution DB 600 may be mounted in the verification support apparatus 200 or on an external server communicable via a network.

Figure 7:
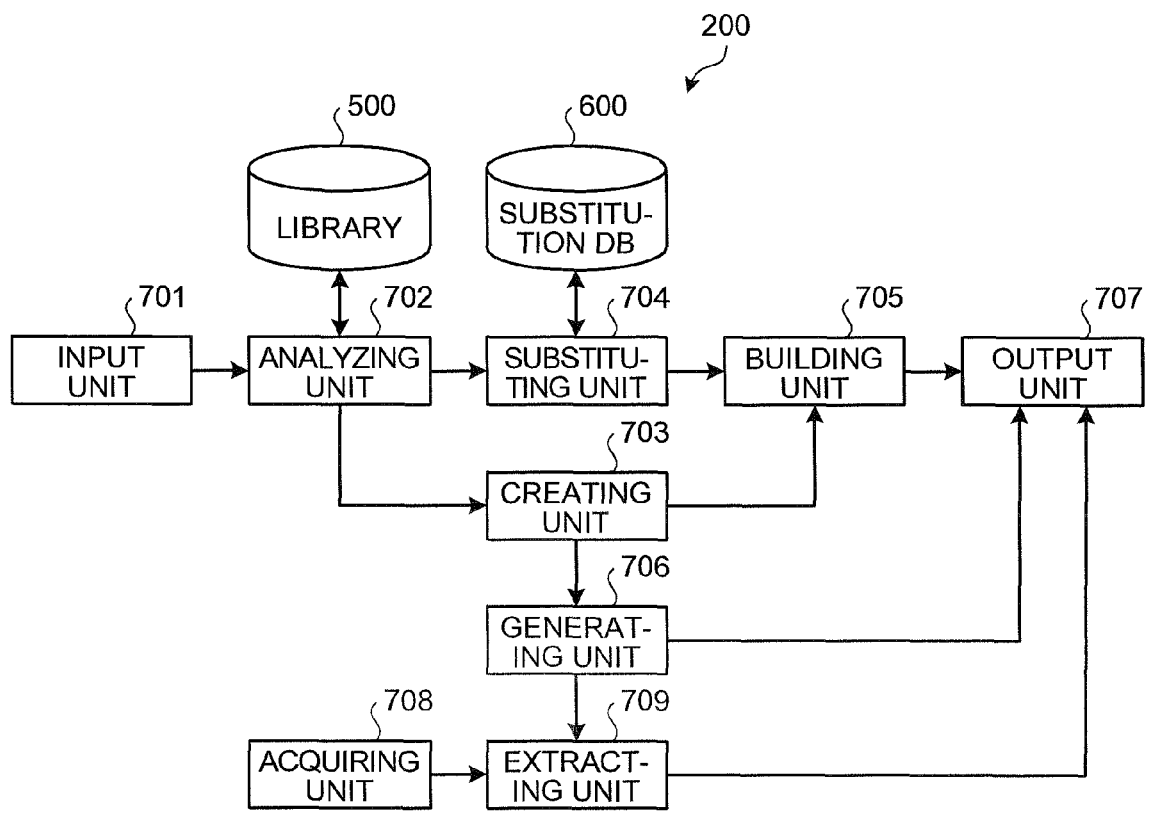
FIG. 7 is a functional diagram of the verification support apparatus.

FIG. 7 is a functional diagram of the verification support apparatus. As depicted in FIG. 7, the verification support apparatus 200 includes an input unit 701, an analyzing unit 702, a creating unit 703, a substituting unit 704, a building unit 705, a generating unit 706, an output unit 707, an acquiring unit 708, and an extracting unit 709.

The functional units (701 to 709) may be implemented by causing a CPU to execute relevant programs stored in the HDD of the verification support apparatus 200, or through an input/output I/F. Further, data output from each of the functional units (701 to 709) is stored in a memory unit such as the HDD, the optical disk 211, flash memory, etc. Functional units (701 to 709) at connection destinations, indicated by arrows in FIG. 7, read, from the memory unit, data output from functional units (701 to 709) at the corresponding connection sources and cause relevant programs to be executed by the CPU.

The input unit 701 receives design data for the system under design 300. The design data is, for example, a netlist for the system under design 300 after logical synthesis. In the netlist, connection relationships of the CPU 301-*i* and internal cells (FF and RAM) making up the system under design 300 are described using the internal cell names.

The analyzing unit 702 analyses the design data received by the input unit 701. More specifically, for example, the analyzing unit 702, by referencing the library 500 depicted in FIG. 5 and using the names described in the netlist as clues, identifies connection relationships of the system under design 300, the category and type of a module, internal connection relationships of the module, a combinational circuit, the category and type of a sequential circuit, an input pin, and an output pin.

Further, the number of modules of an identical category and type is also identified. The analyzing unit 702 further identifies, based on the names described in the netlist, combinational circuits common to each CPU 301-*i* for a sharing of the combinational circuits.

Figure 8:
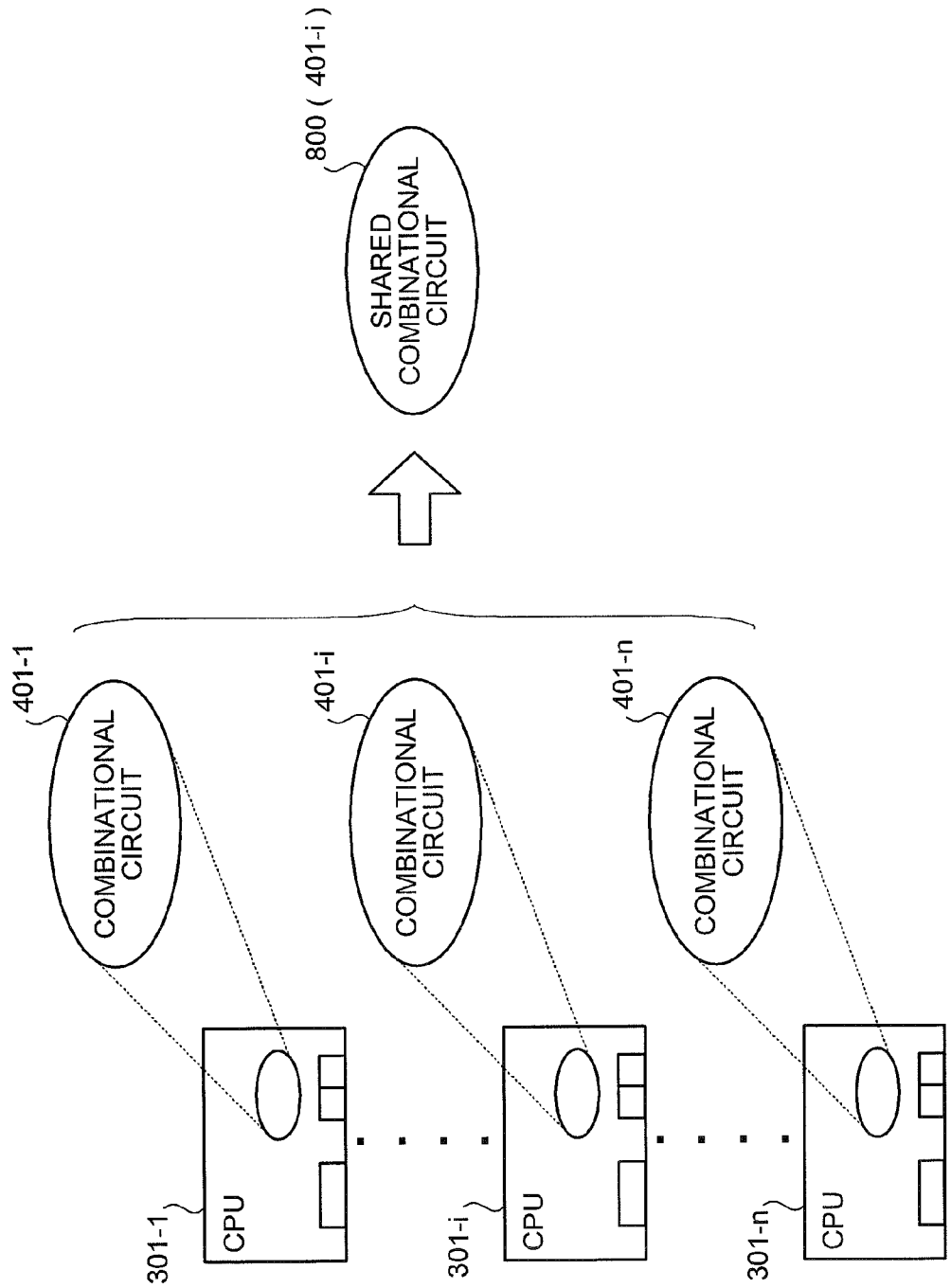
FIG. 8 is a schematic of combinational circuit sharing.

FIG. 8 is a schematic of combinational circuit sharing. As depicted in FIG. 8, since combinational circuits 401-1 to 401-*n* have identical configurations in the CPUs 301-1 to 301-*n*, any one combinational circuit 401-*i* may be a representative circuit. Hereinafter, any one combinational circuit 401-*i* that is a representative circuit is described as a shared combinational circuit 800.

The shared combinational circuit 800 may be obtained by copying HDL described text data of the combinational circuit 401-*i*. Thus, the volume of circuit data of the combinational circuit for simulation can be reduced to 1/n.

Returning to description with reference to FIG. 7, the creating unit 703 creates a control circuit based on an analysis result by the analyzing unit 702. Here, the control circuit is for time-division-operation of the system under design 300 or of a module that is an output result from the verification support apparatus 200. The control circuit is formed, for example, by an incrementing counter.

If the control circuit is formed by a counter, the creating unit 703 determines the count number by detecting the number of CPUs 301-*i* of an identical category and type from the analyzing unit 702. Specifically, if the number of the CPUs 301-*i* is n, a control circuit is generated such that the count value is incremented at the arrival of each clock up to n1, where the initial count value is one and the counter is reset to one when count value reaches n1.

Arrival timing of a clock to a counter is simultaneous with the arrival timing of the clock to other FFs. Output signal at count value i from the counter is denoted as $C(i)$; i.e., at clocks from count values 1 to n, a group of common sequential circuit elements (e.g., FF 421-1 to 421-*n*) is time-division-operated, and at a clock count value of n1, a common I/F is operated. The common I/F is described hereinafter.

The substituting unit 704 substitutes the substitution modules 601 to 603 for the sequential circuit 402-*i*, the input pin 303-*i*, and the output pin 304-*i* that are analyzed/identified by the analyzing unit 702. Here, examples of the substitution of the sequential circuit 402-*i*, the input pint 303-*i*, and the output pin 304-*i* are described.

Figure 9:
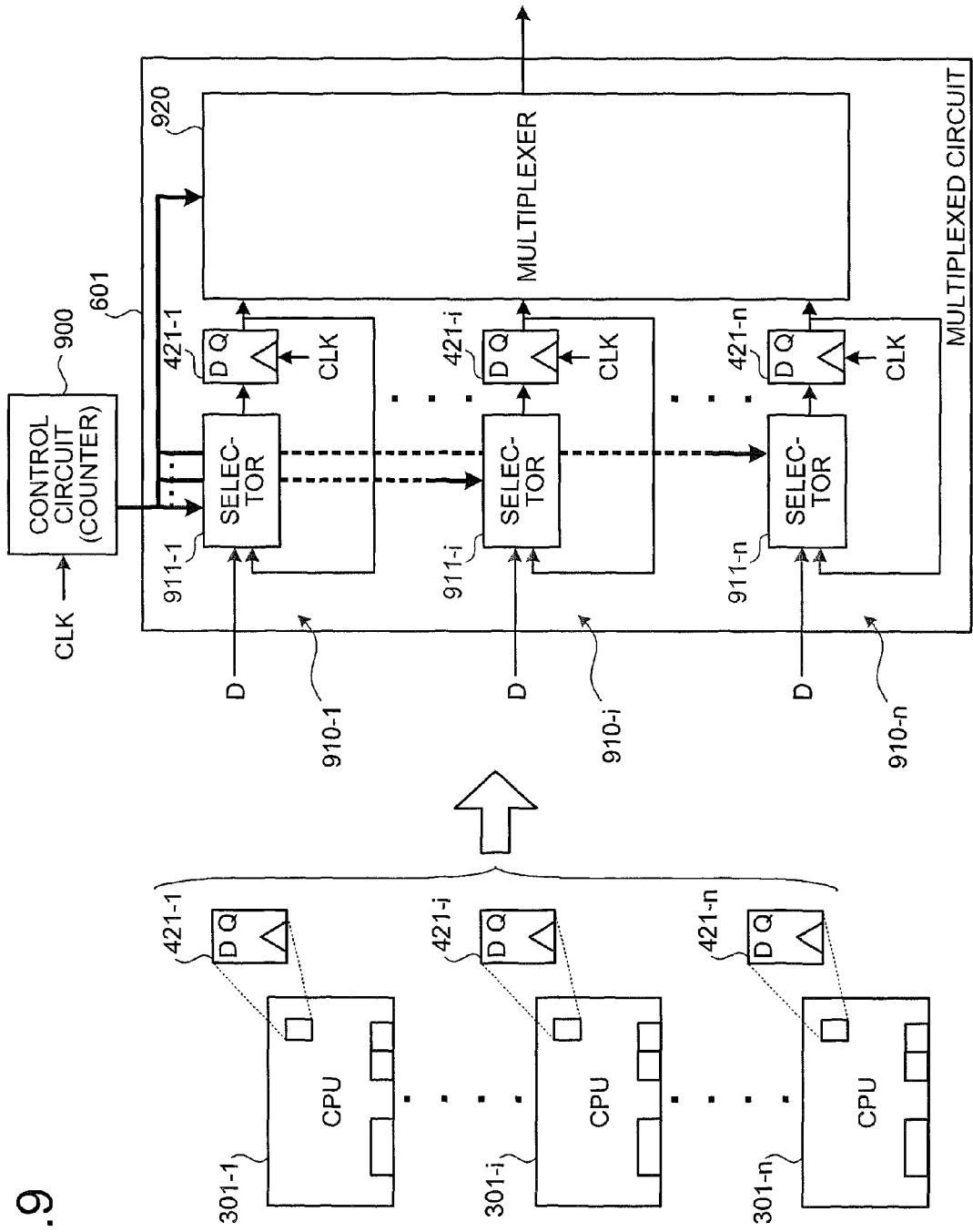
FIG. 9 is a schematic of an example of the substitution of a sequential circuit.

FIG. 9 is a schematic of an example of the substitution of a sequential circuit. FIG. 9 depicts an example in which the substitution module 601 is substituted for a group of sequential circuit elements (n FFs 421-1 to 421-*n*) common to each of the sequential circuits 402-1 to 402-*n* of n CPUs 301-1 to 301-*n* that are of an identical category and type.

The substitution module 601 includes n circuit blocks 910-1 to 910-*n* and a multiplexer 920 that selectively outputs output data from any one circuit block 910-*i* to the shared combinational circuit 800. The substitution module 601 is connected to the control circuit 900. A circuit block 910-*i* is formed by a selector 911-*i* and the FF 421-*i* that are connected directly with each other, and data output from the FF 421-*i* is fed back to the selector 911-*i*.

The FF 421-*i* outputs data Q stored therein to the multiplexer 920 when the count value is i. The selector 911-*i* receives data output from the shared combinational circuit 800 and from the FF 421-*i*, and when the count value is i, receives data D and outputs the data D to the FF 421-*i*.

At other count values, the selector 911-*i* outputs the data Q that has been fed back and input thereto. Thus, the FF 421-*i* is ensured to constantly maintain an FF value corresponding to the CPU 301-*i*. The multiplexer 920, upon receiving a count signal $C(i)$, selects from among the data Q respectively output from the circuit blocks 910-1 to 910-*n*, the data Q from the circuit block 910-*i* and outputs the data Q selected to the shared combinational circuit 800.

If substitution is performed using Verilog, the substitution process may be implemented through simple text processing by substituting DUMMY FF (CLK, D, Q, and counter) for the HDL description of the FF (CLK, D, and Q) that is subject to substitution.

Figure 10:
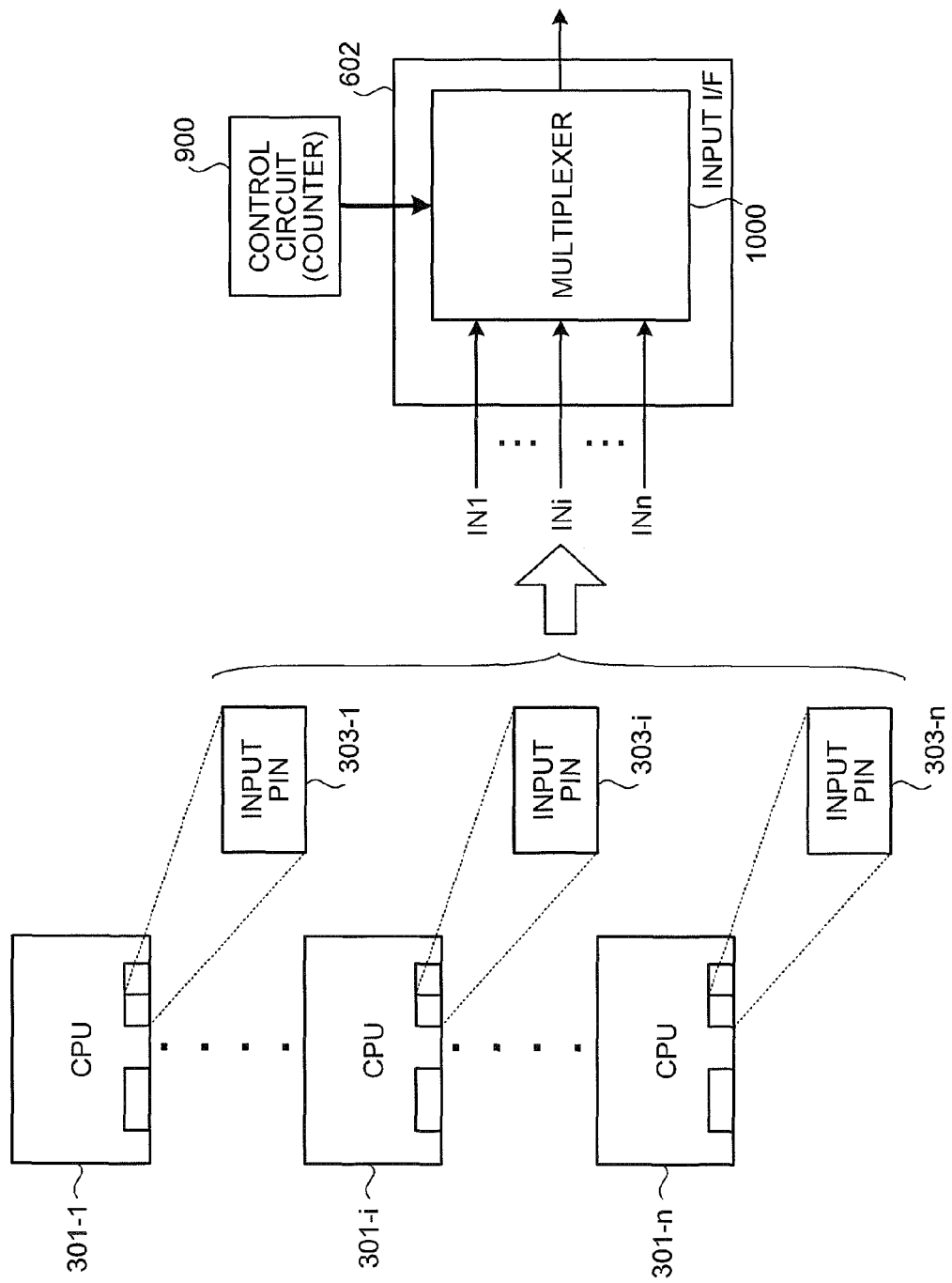
FIG. 10 is a schematic of an example of the substitution of an input pin.

FIG. 10 is a schematic of an example of the substitution of an input pin. FIG. 10 depicts an example in which the substitution module 602 is substituted for the input pins 203-1 to 203-*n* of n CPUs 301-1 to 301-*n* that are of an identical category and type.

The substitution module 602 includes an n-input/one-output type multiplexer 1000. The multiplexer 1000 is connected to the control circuit 900, and upon receiving a count signal $C(i)$, selects from among input data IN1 to INn of the CPUs 301-1 to 301-*n*, input data INi of the CPU 301-*i* and outputs the input data INi selected to the shared combinational circuit 800.

FIG. 11 is a schematic of an example of the substitution of an output pin. FIG. 11 illustrates an example in which the substitution module 603 is substituted for the output pins 204-1 to 204-*n* of n CPUs 301-1 to 301-*n* that are of an identical category and type.

The substitution module 603 includes n circuit blocks 1110-1 to 1110-*n*. The circuit blocks 1110-1 to 1110-*n* are connected to the control circuit 900 and receive a count signal $C(i)$. A circuit block 1110-*i* includes a selector 1111-*i* and an FF 1112-*i* that are directly connected, and data output from the FF 1112-*i* is fed back and input to the selector 1111-*i*.

If a signal output from the CPU 301-*i* may reach a CPU 301-*j* through a bus within one clock, additional processing is required for computing the value of the output pin. Specifically, the value of the counter being incremented up to 2n2, the state of a combinational circuit of the CPU 301-*i* when the value of the counter is n1i is simulated, and a value of the output pin obtained is stored in the FF 1112-*i*. By this processing, the correct value is input even if a signal arrives within one cycle since the value of the output pin at the next cycle has been computed in advance when the counter is 1 to n. As a signal that reaches another CPU (CPU 301-*j*) within one clock is generally rare, here the substitution example does not consider such a signal.

The FF 1112-*i* outputs the data Q stored therein to the bus 220 when a count value is i. The selector 1111-*i* receives the data D and the data Q respectively output from the shared combinational circuit 800 and the FF 421-*i*, and when a count value is i, receives and outputs the data D to the FF 1112-*i*. At other count values, the data Q that has been received as feedback is output.

If substitution is performed using Verilog, the substitution may be executed by simple replacements and additions by using a stub module.

Figure 12A:
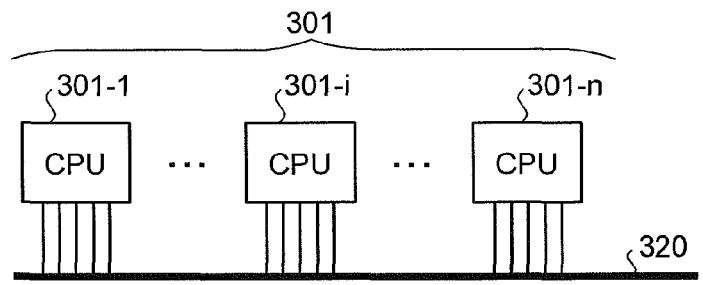
FIGS. 12A to 12C are schematics of a typical I/F conversion process.
Figure 12B:
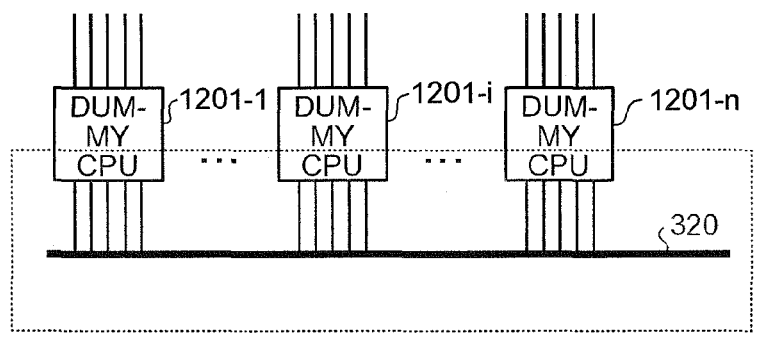
Figure 12C:
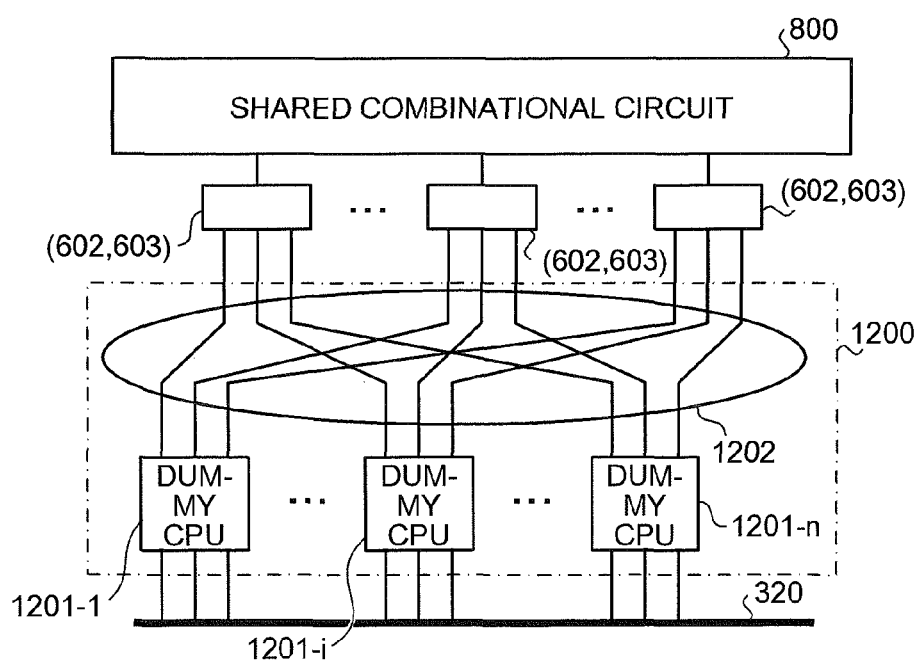

FIGS. 12A to 12C are schematics of a typical I/F conversion process. Dummy CPUs 1201-1 to 1201-*n* depicted in FIG. 12B are created by copying the CPUs 301-1 to 301-*n* depicted in FIG. 12A. Since connection relationships (region enclosed by dotted line) between the dummy CPUs 1201-1 to 1201-*n* and the bus 220 do not vary from those between the CPUs 301-1 to 301-*n* and the bus 220, an existing netlist may be applied without modification.

As depicted in FIG. 12C, a common I/F 1200 may be built by connecting an I/F circuit 1202 between the dummy CPUs 1201-1 to 1201-*n* and the substituted input/output pins (substitution modules 602 and 603) of the shared combinational circuit 800. Thus, input/output signals of each CPU 301-*i* before multiplexing pass through each of the dummy CPUs 1201-*i* and the substitution process is simply implemented.

Returning to description with reference to FIG. 7, the building unit 705 builds a single module by connecting the substitution modules 601 to 603, the shared combinational circuit 800, and the control circuit 900. FIG. 13 is a schematic of a single module built by the building unit.

As depicted in FIG. 13, a single module 1301 is a module that is substituted for the multiplex module 301 that includes the CPUs 301-1 to 301-*n*. In other words, the shared combinational circuit 800 is substituted for n combinational circuits 401-1 to 401-*n*, a multiplexed sequential circuit 1310 including a multiplexed circuit (substitution module 601) group is substituted for n sequential circuits 402-1 to 402-*n*, and the common I/F 1200 including a single input I/F (substitution module 602) and a single output I/F (substitution module 603) is substituted for n input pins 203-1 to 203-*n* and n output pins 204-1 to 204-*n*, respectively.

The control circuit 900 is connected to the multiplexed sequential circuit 1310 and the common I/F 1200. Among count signals C(1) to C(n1) output from the control circuit 900, count signals C(1) to C(n) are output to the multiplexed sequential circuit 1310, and at each state (count value) i, sequential circuit elements (FF and RAM) are time-division operated. The count signal C(n1) is output to the common I/F 1200 for input/output operation in a state i1.

Configuration is such that the common I/F 1200 is provided with a clock CLK only when count value C(n1) is output to a clock gate CG so that the common I/F 1200 operates for input/output only in the state i1.

Thus, by substituting the single module 1301 for the multiplex module 301, the circuit volume of a system under design 1300 post-conversion may become smaller than that before the conversion, and the circuit data volume may be drastically reduced.

The generating unit 706 generates information correlating timing of the time-division operation of the group of common sequential circuit elements (FF and RAM) with the module (CPU and memory) having the sequential circuit element operated at the respective timings.

FIG. 14 is one example of a correlation table generated by the generating unit. As depicted in FIG. 14, in a correlation table 1400, the count value 1 to n of the control circuit 900 and the CPU 301-1 to 301-*n* having the sequential circuit element (for example, FF421-1 to 421-*n*) operated at the respective count value 1 to n are correlated and stored.

As described hereinafter, the correlation table 1400 is used to extract respective signal waveforms for each of the signals of the (pre-conversion) system under design 300 from the verification results of the (post-conversion) system under design 1300. In other words, by referencing the correlation table 1400, the CPU 301-1 to 301-*n* having the sequential circuit element that is time-division operated at state (count value) i can be identified. The correlation table 1400 is implemented by, for example, a memory unit such as the HDD, the optical disk 211, flash memory, etc.

The output unit 707 outputs design data concerning a building result of the building unit 705 and the information generated by the generating unit 706. Specifically, the output unit 707 outputs design data (netlist) concerning the system under design 1300, which is new and includes the single module 1301 post-conversion (depicted in FIG. 13), and the correlation table 1400 (depicted in FIG. 14).

In addition to screen display by the display 231 and print out by the printer 233, forms of output by the output unit 707 include the writing of data to a memory unit of the verification support apparatus 200 such as the HDD, the optical disk 211, flash memory, etc. and transmission to a simulator.

The acquiring unit 708 acquires verification results for the system under design 1300 that includes the single module 1301 built by the building unit 705. Specifically, with the verification support apparatus 200, simulation of the system under design 1300 is performed and results of the simulation may be acquired. Further, by transmitting design data concerning the system under design 1300 to a simulator, simulation results from the simulator may be acquired.

The extracting unit 709, using the correlation table 1400 generated by the generating unit 706, extracts verification results for each of the CPUs 301-1 to 301-*n* from the verification results that are acquired by the acquiring unit 708 and are for the system under design 1300 having the single module 1301.

FIG. 15 is a schematic outlining extraction processing performed by the extraction unit. As depicted in FIG. 15, a signal waveform 1500 of a signal A is correlated with count values of the control circuit 900 and indicated as verification results for the system under design 1300. The signal waveform 1500 expresses waveforms of the signals A regarding the multiplex module 301 (CPU 301-1 to 301-*n*) as one signal waveform.

The extracting unit 709, using verification results of the system under design 1300 (the signal waveform 1500) and the correlation table 1400 depicted in FIG. 14, extracts a value of the signal A for each of the CPUs 301-1 to 301-*n*. For example, referring to the correlation table 1400, the extracting unit 709 extracts verification results for the CPU 301-1 (signal waveform 1510) by extracting, sequentially with respect to time, the value of the signal A correlated with the count value 1.

Similarly, with respect to CPUs 301-2 to 301-*n*, the values of signal A corresponding respectively to each count value 2 to n are extracted, thereby enabling extraction of verification results for the CPUs 301-2 to 301-*n*.

The output unit 707 outputs the verification results extracted by the extracting unit 706 for each of the CPUs 301-2 to 301-*n*. For example, the signal waveform 1510 depicted in FIG. 15 is output as a verification result for the CPU 301-1. Thus, the waveform of each of the signals of the (pre-conversion) system under design 300 can be referenced to improve the efficiency of debugging work.

Figure 16:
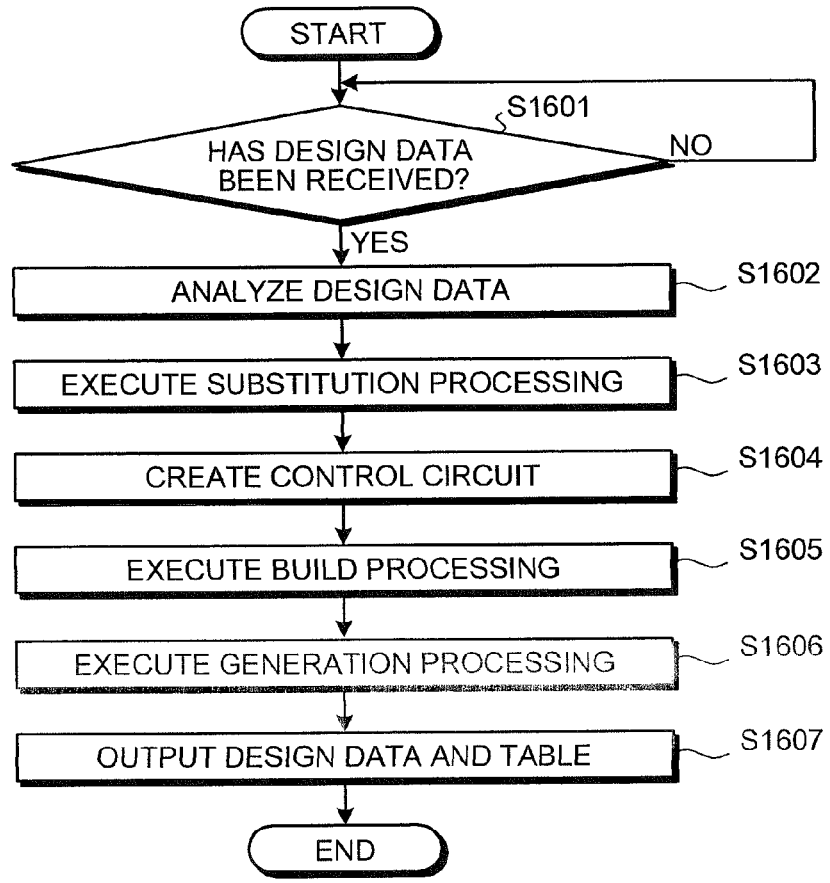
FIG. 16 is a flowchart of verification processing performed by the verification support apparatus according to the first embodiment.

FIG. 16 is a flowchart of verification processing performed by the verification support apparatus 200 according to the first embodiment. As depicted in FIG. 16, the input unit 701 determines whether design data (netlist) concerning the system under design 300 has been received (step S1601).

Receipt of the design data (netlist) concerning the system under design 300 is waited for (step S1601: NO). When the design data is received (step S1601: YES), the analyzing unit 702 analyzes the design data (step S1602).

Next, the substituting unit 704 substitutes the substitution modules 601 to 603 for the sequential circuit 402-$i$, the input pin 303-$i$, and the output pin 303-$i$ identified through the analysis by the analyzing unit 702 (step S1603). The creating unit 703 creates the control circuit 900 that counts clocks in cycles of n1 (step S1604), where n is the number of CPUs identified (through the analysis result obtained by the analyzing unit 702) to be of an identical category and type, and one is added thereto.

Subsequently, as depicted in FIG. 13, the building unit 705 builds the (post-conversion) single module 1301 (step S1605). The generating unit 706 generates the correlation table 1400 correlating values of the counter of the control circuit 900 and the CPU 301-1 to 301-$n$ having the sequential circuit element operated at the respective value (step S1606).

Finally, the output unit 707 outputs the correlation table 1400 and design data concerning the system under design 1300, which is new and includes the (post-conversion) single module 1301, thus ending a series of the processing.

Figure 17:
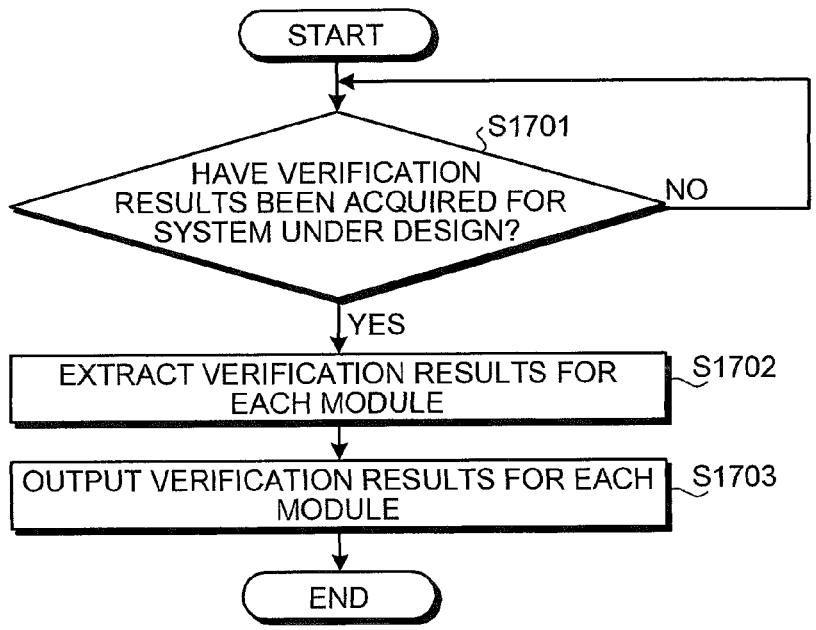
FIG. 17 is another flowchart of the verification processing performed by the verification support apparatus according to the first embodiment.

Here, processing for the extraction of signal waveforms for each of the CPUs 301-1 to 301-$n$ of the (pre-conversion) system under design 300 from the verification results of the (post-conversion) system under design 1300 is described. FIG. 17 is another flowchart of the verification processing performed by the verification support apparatus according to the first embodiment.

As depicted in FIG. 17, the acquiring unit 708 determines whether verification results for the system under design 1300 having the single module 1301 have been acquired (step S1701).

Here, acquisition of the verification results for the system under design 1300 is waited for (step S1701: NO). When verification results for the system under design 1300 are acquired (step S1701: YES), the extracting unit 709 uses the correlation table 1400 generated at step S1606 depicted in FIG. 16 to extract, from the verification results of the system under design 1300, verification results for the CPUs 301-1 to 301-N, respectively (step S1702).

Finally, the output unit 707 outputs verification results for the CPUs 301-1 to 301-$n$, respectively (step S1703, thus ending a series of processing according to the flowchart.

Thus, according to the first embodiment, each of the CPUs 301-1 to 301-$n$ are separated into combinational circuits 401-1 to 401-$n$ and sequential circuits 402-1 to 402-$n$ and any combinational circuit 401-$i$ among the combinational circuits 401-1 to 401-$n$ is shared among all of the CPUs 301-1 to 301-$n$.

Further, when operation of the system under design 300 is simulated, the control circuit 900 is created to perform control such that internal operation of the CPU 201-$i$ is simulated at the i-th clock CLK (i 1 to n) and operation of the common I/F 1100 is simulated at (n1)-th clock CLK.

Thus, operation of the original system 300 for one clock is simulated by the (n1) clock CLK. Although the (post-conversion) single module 1301 becomes n1 times slower compared to the (pre-conversion) multiplex module 301 of the system under design 300, the circuit scale thereof is smaller as the combinational circuits 401-1 to 401-$n$ are shared.

Hence, there is an advantage in that simulation can be performed for the system under design 300, which has a scale exceeding the simulation capacity of a conventional simulator and that conventionally is impossible to simulate. Thus, by providing a simulator with the design data for the system under design 1300, which has the single module 1301 for which data volume has been reduced, a designer can thoroughly verify operation of the original system under design 300.

Further, the correlation table 1400 that correlates values of the counter of the control circuit 900 and the CPU 301-1 to 301-$n$ having the sequential circuit element (e.g., FF 421-1 to 421-$n$) operated at the respective value is generated and used to extract, from verification results of the system under design 1300 and for each module 301-1 to 301-$n$, a waveform of each signal of the original system under design 300.

Hence, signal waveforms for each of the signals can be referenced for each CPU 301-1 to 301-$n$ as verification results for the system under design 1300, thereby facilitating efficient debugging by the user when a bug is found.

According to the first embodiment, the system under design 300 included one type multiplex module 301; however, a system having multiple types of multiplex modules may be the subject of design.

Figure 18:
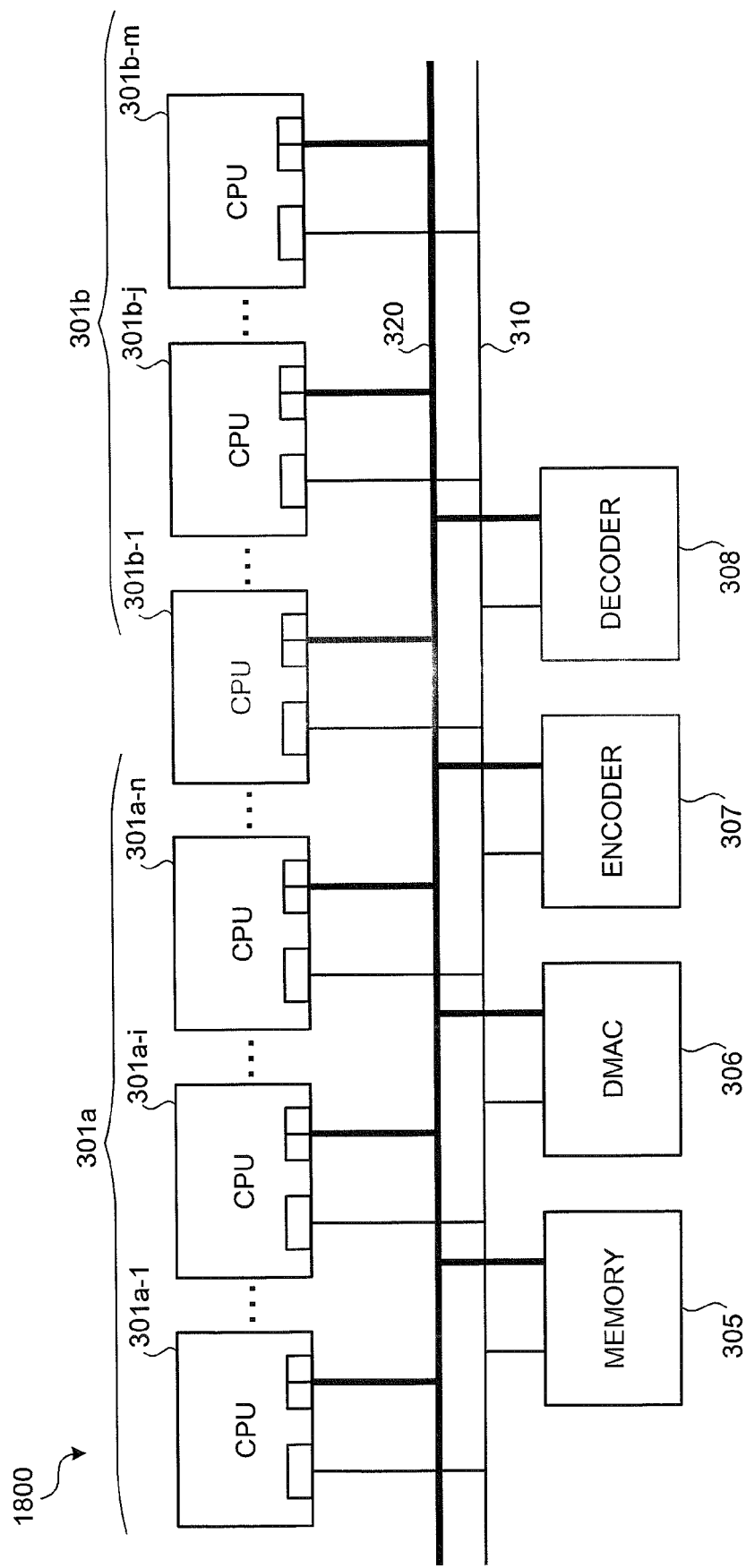
FIG. 18 is a schematic of a system under design having multiple types of multiplex modules.

FIG. 18 is a schematic of a system under design having multiple types of multiplex modules. As depicted in FIG. 18, a system under design 1800 includes two multiplex modules 301$a$, 301$b$ that are of an identical category (CPU), but are of differing types. In other words, the multiplex module 301$a$ has n CPUs 301$a$-1 to 301$a$-$n$, while multiplex module 301$b$ has m (n>m) CPUs 301$b$-1 to 301$b$-$m$.

Elements of the multiplex module 301$a$ are indicated by an "a" appended at the end of the reference numerals respective thereto, while reference numerals indicative of elements of the multiplex module 301$b$ are appended with a "b". For example, an arbitrary CPU of the multiplex module 301$a$ is indicated as CPU 301$a$-$i$.

The number of CPUs n, m respectively in the multiplex modules 301$a$, 301$b$ of the system under design 1800 are identified by the analyzing unit. The creating unit 703 comparing values n and m, sets the upper limit of the counter of the control circuit 900 based on the relatively larger value n to n1.

Figure 19:
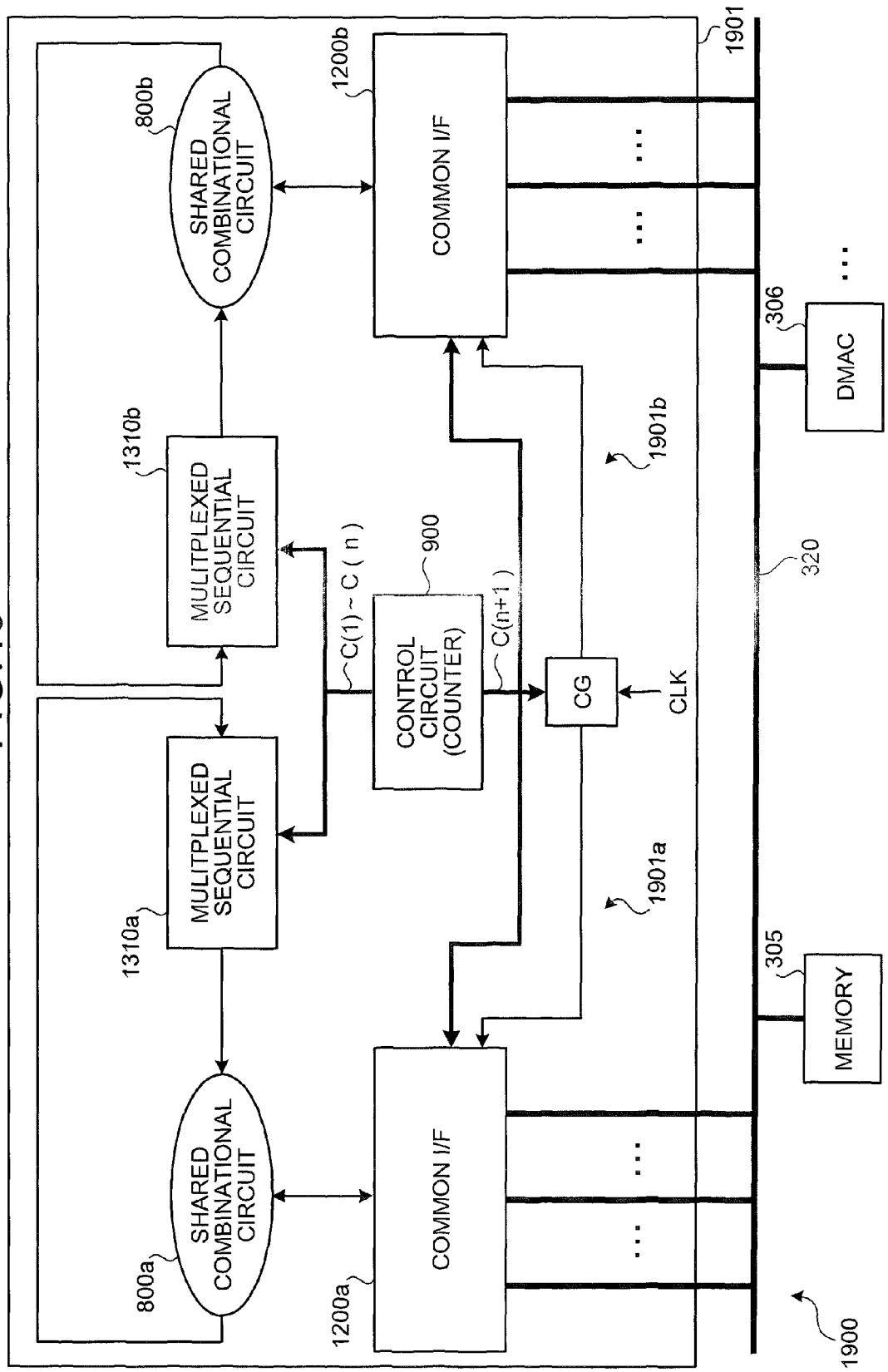
FIG. 19 is a schematic of a system under design built by the building unit.

FIG. 19 is a schematic of a system under design built by the building unit. As depicted in FIG. 19, a system under design 1900 includes an integrated module 1901 including (post-conversion) single modules 1901$a$, 1901$b$, the control circuit 900, and a clock gate CG. The integrated module 1901 is a module that replaces the two pre-conversion multiplex modules 301$a$, 301$b$.

The single module 1901$a$ includes a shared combinational circuit 800$a$, a multiplexed sequential circuit 1310$a$, and a common I/F 1200$a$. The single module 1901$b$ includes a shared combinational circuit 800$b$, a multiplexed sequential circuit 1310$b$, and a common I/F 1200$b$. The control circuit 900 and the clock gate CG are shared by the (post-conversion) single modules 1901$a$, 1901$b$.

Here, the control circuit 900 counts from a count value of 1 to n1, where the count value subsequent to n1 is reset to 1. As a result, in the single module 1901$a$, the multiplexed sequential circuit 1310$a$ is time-division operated from the count values 1 to n and at the count value n1, the common I/F 1200$a$ is operated.

In the single module 1901$b$, the multiplexed sequential circuit 1310$b$ is time-division operated from the count values 1 to m, no operation occurs from count value m1 to n, and when the count value becomes n1, the common I/F 1200$b$ is operated.

Thus, when there are plural multiplex modules, the upper limit of the count value of the control circuit 900 is set based on the greatest number of CPUs in a multiplex module, thereby enabling a reduction of the circuit data volume and a shortening of the simulation time. Here, description was given where n>m; however, the embodiment can be similarly implemented if n=m.

FIG. 20 is schematic of another example of the correlation table generated by the generating unit. As depicted in FIG. 20, in a correlation table 2000, the count values 1 to n of the control circuit 900 and the CPU 301*a*-1 to 301*a*-*n*, 301*b*-1 to 301*b*-*m* (n>m) having the sequential circuit element operated at the respective count value 1 to n are correlated and stored.

Reference of the correlation table 2000 enables, for each state (count value), identification of the CPU 301*a*-1 to 301*a*-*n*, 301*b*-1 to 301*b*-*m* having the sequential circuit element time-division operated at the respective state.

Thus, signal waveforms for each of the CPUs 301*a*-1 to 301*a*-*n*, 301*b*-1 to 301*b*-*m* can be obtained as verification results for the system under design 1900 and when a bug is found, efficient debugging by the user can be facilitated.

Figure 21:
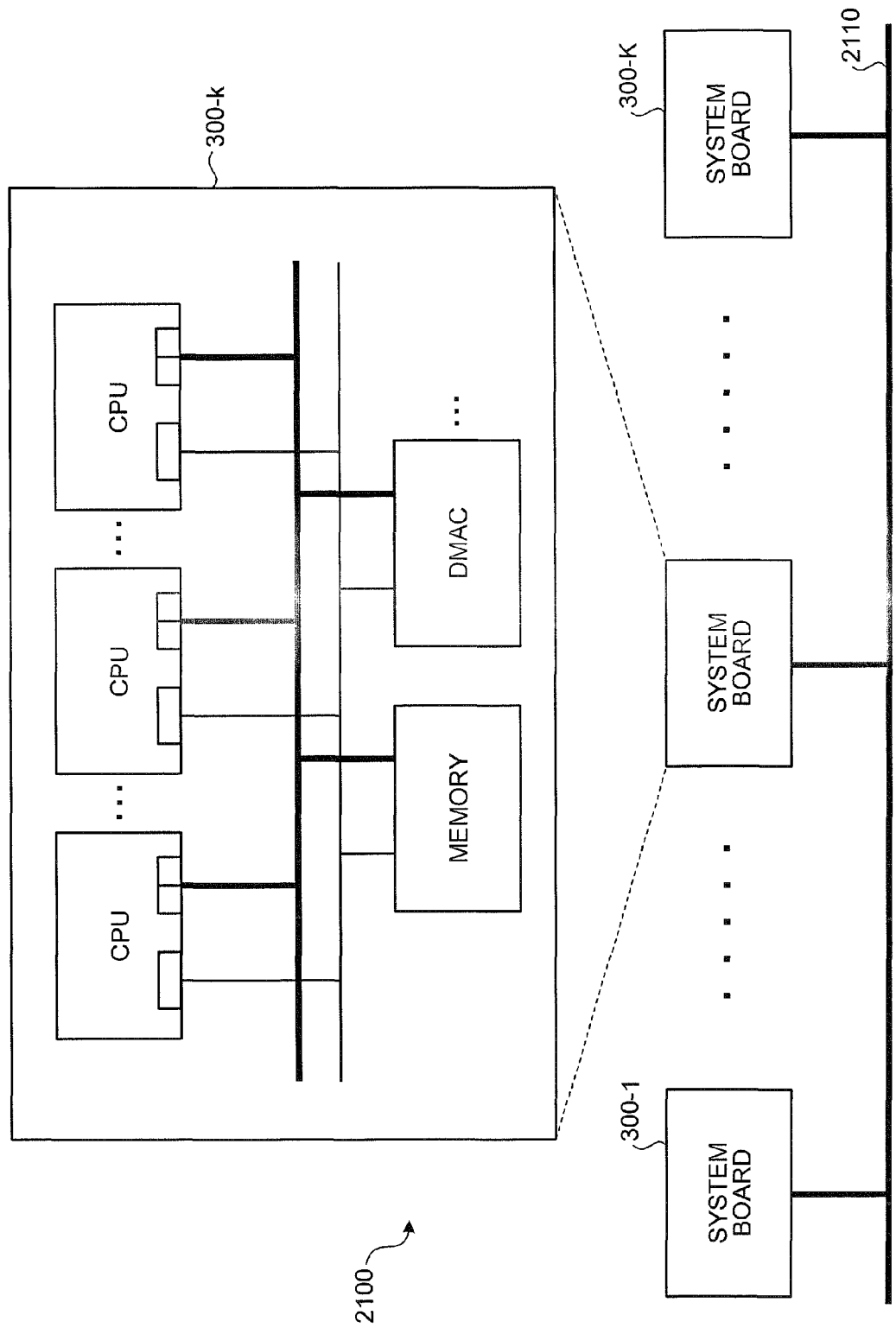
FIG. 21 is a schematic of a multiplexed system under design.

Furthermore, a multiplex system under design, where multiple systems under design 300 are mounted as system boards, may be a subject of design. FIG. 21 is a schematic of a multiplexed system under design. As depicted in FIG. 21, a multiplexed system under design is a system where the system under design 300 depicted in FIG. 3 is provided in plural, mounted as system boards. In other words, in the multiplexed system under design 2100, system boards 300-1 to 300-K are connected through a bus and operated in parallel.

Figure 22:
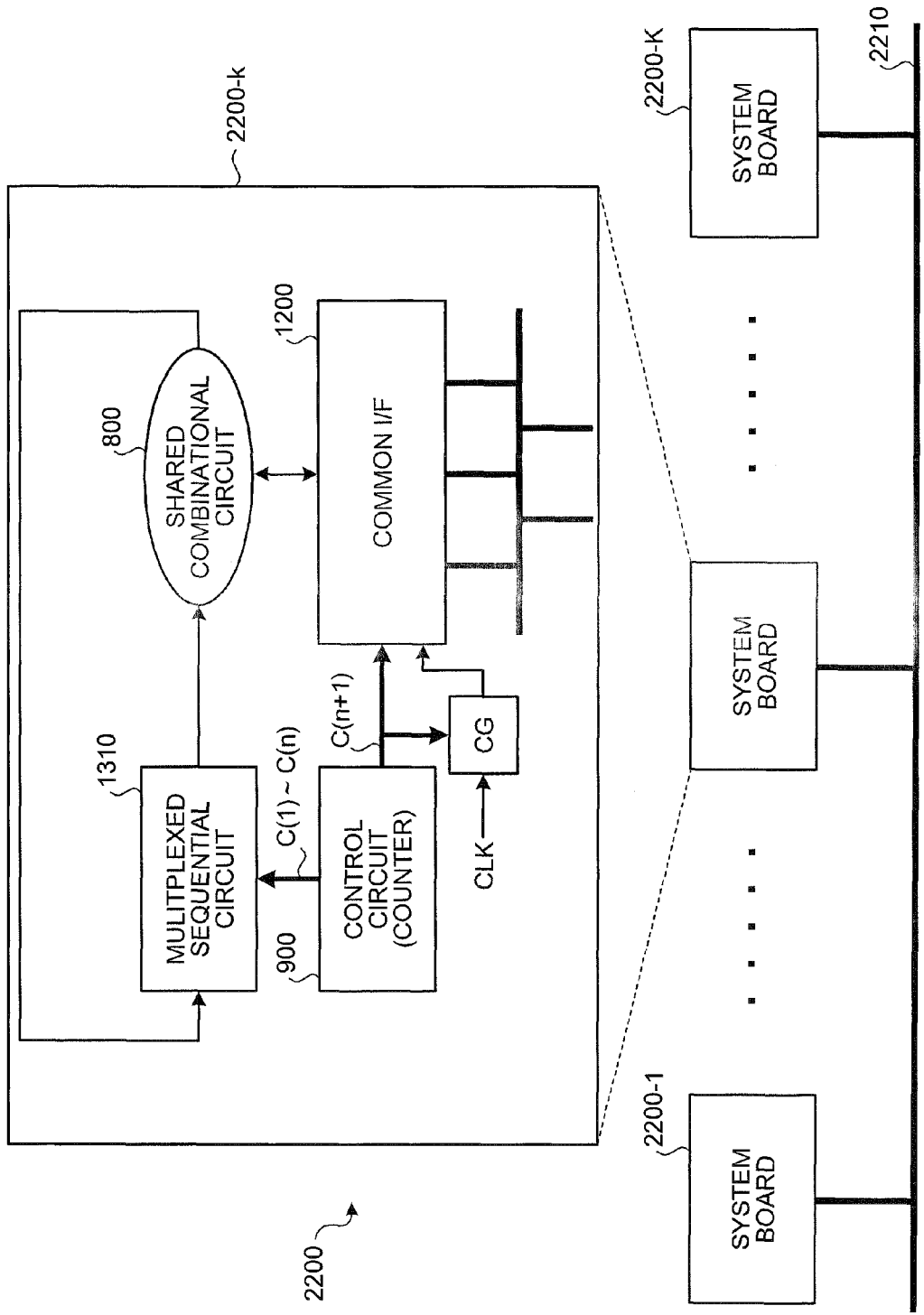
FIG. 22 is a schematic of a multiplexed system under design built by the building unit.

FIG. 22 is a schematic of a multiplexed system under design built by the building unit. In a multiplexed system under design 2200, each system board 2200-1 to 2200-K has a configuration identical to the configuration of the system under design 1300 post-building depicted in FIG. 13. If design data (netlist) concerning the multiplexed system under design 2200 is simulated, as depicted in FIG. 21, the number of CPUs for each of the system boards 300-K is n and the number of system boards is K; therefore, the count number becomes (n1)×K.

FIG. 23 is a schematic of another example of the correlation table generated by the generating unit. Here the modules that each of the system boards 2200 has are indicated as CPUs 301-*k*-1 to 301-*k*-*n*.

As depicted in FIG. 23, in a correlation table 2300, count values 1 to (n1)×K and the CPU 301-1-1 to 301-1-*n*, . . . , CPU 301-*k*-1 to 301-*k*-*n*, . . . , CPU 301-K-1 to 301-K-n having the sequential circuit element operated at the respective count value 1 to (n1)×K are correlated and stored.

Reference of the correlation table 2300 enables, for each state (count value), identification of the CPU 301-1-1 to 301-1-*n*, . . . , CPU 301-*k*-1 to 301-*k*-*n*, . . . , CPU 301-K-1 to 301-K-n having the sequential circuit element time-division operated at the respective state.

Thus, signal waveforms for each of the CPUs 301-1-1 to 301-1-*n*, . . . , CPU 301-*k*-1 to 301-*k*-*n*, . . . , CPU 301-K-1 to 301-K-n can be obtained as verification results for the system under design 2200 and when a bug is found, efficient debugging by the user can be facilitated.

According to the first embodiment, waveforms of each of the signals of the (pre-conversion) system under design 300 are generated using the correlation table 1400. However, according to a second embodiment, waveforms of each of the signals of the (pre-conversion) system under design 300 are generated using output values stored in the sequential circuit during verification of the (post-conversion) system under design 1300.

Hereinafter, according to the second embodiment, description is given where a group of sequential circuit elements (FF 421-1 to 421-*n*) common to each of the sequential circuits 402-1 to 402-*n* are multiplexed into a multiplexed circuit as a sequential circuit. Further, only points differing from the first embodiment are described. Components identical to those of the first embodiment are given identical reference numerals and description thereof is omitted.

Figure 24:
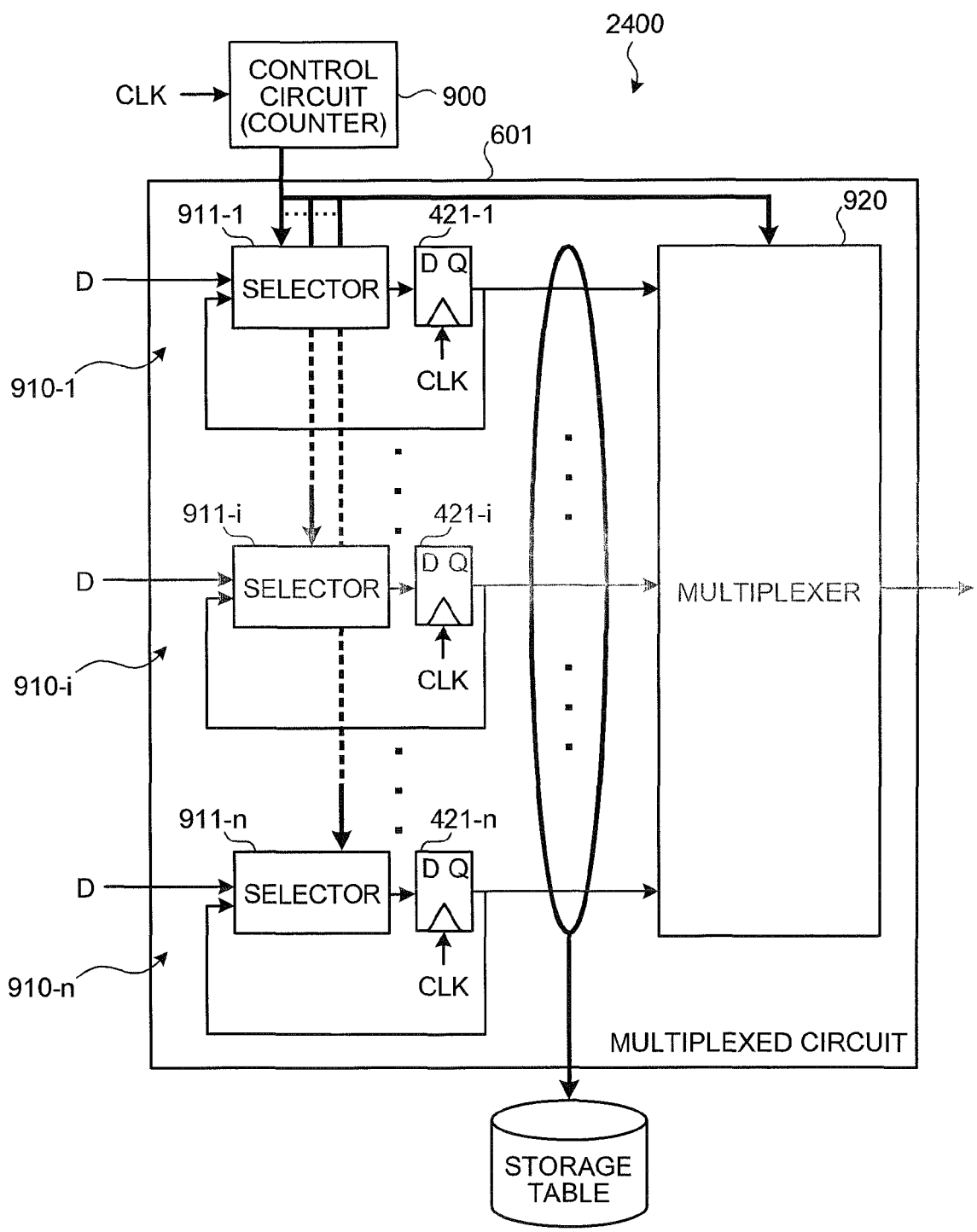
FIG. 24 is a schematic summarizing the second embodiment.

FIG. 24 is a schematic summarizing the second embodiment. As depicted in FIG. 24, a multiplexed circuit 2400 is a multiplex module (substitution module 601) included in the multiplexed sequential circuit 1310 of the system under design 1300 depicted in FIG. 13. In the multiplexed circuit 2400, FF 421-*i* outputs the data Q stored therein to the multiplexer 920 at the count value i.

According to the second embodiment, for a clock cycle delimited by the arrival of a clock signal (count value n1 of the control circuit) during verification of the circuit under design 1300, the data Q output from each of the FF 421-*a* to 421-*n* of the multiplexed circuit 2400 is stored. When verification is complete, according to an arbitrary clock specified by the user, the values of the FFs 421-1 to 421-*n* at the specified clock are readout from among the stored results. Using the value readout, values of the combinational circuits 401-1 to 401-*n* respectively corresponding thereto are calculated and the calculated results are output as verification results.

Figures 25, 26:
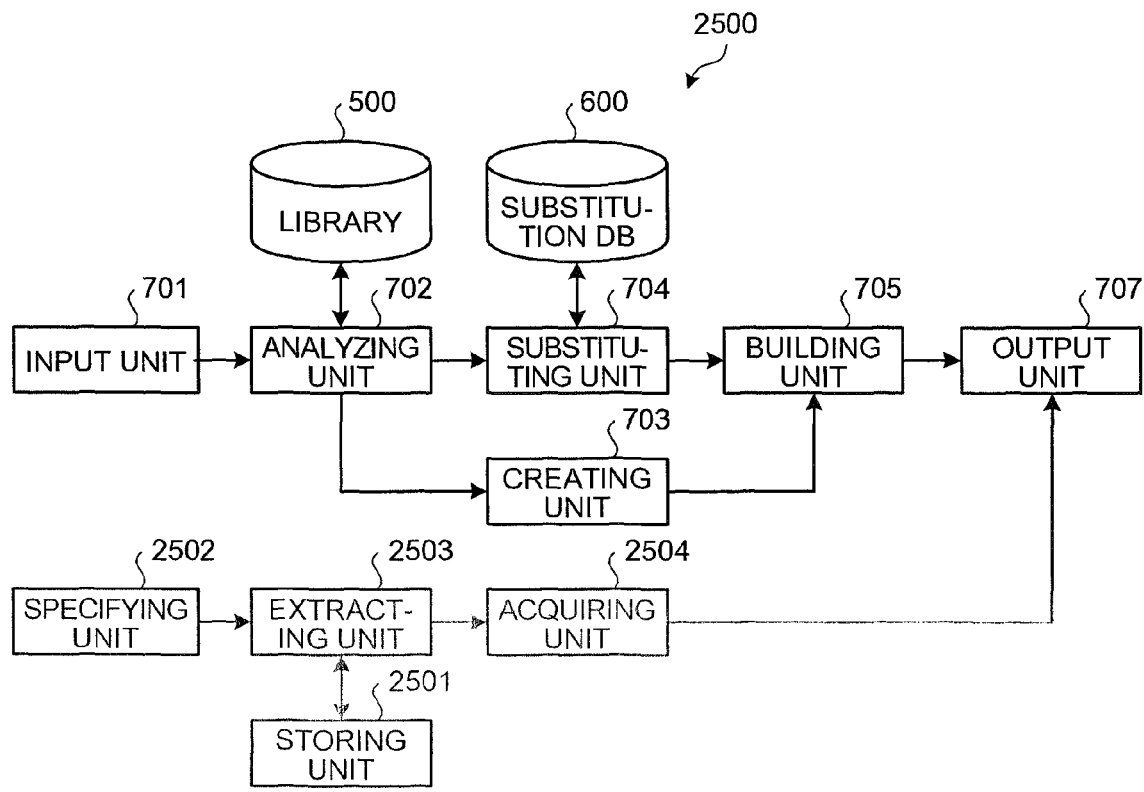
FIG. 25 is a functional diagram of a verification support apparatus according to the second embodiment.
FIG. 26 is a schematic of one example of results stored by the storing unit.

FIG. 25 is a functional diagram of a verification support apparatus according to the second embodiment. As depicted in FIG. 25, a verification support apparatus 2500 includes the input unit 701, the analyzing unit 702, the creating unit 703, the substituting unit 704, the building unit 705, the output unit 707, a storing unit 2501, a specifying unit 2502, an extracting unit 2503, and an acquiring unit 2504.

The storing unit 2501 stores, respectively for each of the sequential circuit elements, the value of the signal output from the sequential circuit resulting from the time-division operation of the sequential circuit elements (for example, FF 421-1 to 421-*n*), by the control circuit 900, during verification of the system under design 1300 having the single module 1301 built by the building unit 705.

FIG. 26 is a schematic of one example of results stored by the storing unit. As depicted in FIG. 26, in a storage table 2600, for each clock cycle of the (pre-conversion) system under design 300, respective values (data Q) of the signals (here, signal X) of the sequential circuit elements (here, FF 421-1 to 421-*n*) at each clock are stored.

Specifically, for a clock delimited by the arrival of a clock signal (count value n1), the data Q output from the FF 421-*i* by the time-division operation thereof when the count value is i is stored. For example, with respect to clock 1 in the (pre-conversion) system under design 300, data Q1-1 to Q1-*n* respectively output from the FF 421-1 to 421-*n* at the clock value 1 to n are stored.

In FIG. 26, only values of the signal X are depicted; however, the values of other signals input into the system under design 300 are stored. Furthermore, although only output values of the FF 421-1 to 421-*n* are depicted in FIG. 26, values for sequential circuit element groups (FF 422-1 to 422-*n*), . . . , (FF 424-1 to 424-*n*), (RAM 425-1 to 425-*n*), . . . , (RAM 427-1 to 427-*n*) (not depicted) are stored as well. The storage table 2600, for example, is implemented by the output of data to a memory unit such as the HDD, the optical disk 211, flash memory, etc.

Returning to the explanation with respect to FIG. 25, the specifying unit 2505 receives specification of an arbitrary verification time that is within the verification period of the system under design 1300. Specifically, for example, the specification of an arbitrary time is received through user-operation of the keyboard 221, the mouse 222, etc. of the input apparatus depicted in FIG. 2. More specifically, for example, a screen displaying verification results (waveforms of each signal) of the system under design 1300 is called, and from among the input signals, an arbitrary signal is specified together with an arbitrary clock within the verification period.

The extracting unit 2503 extracts, from the storage table 2600, the value of the signal of the sequential circuit element group (FF 421-1 to 421-*n*) for the clock specified at the specifying unit 2502. For example, if clock 1 is specified at the specifying unit 2502, the data Q1-1 to Q1-*n* output from the FFs 421-1 to 421-*n* is extracted from the storage table 2600.

The acquiring unit 2504 acquires verification results for the system under design 1300 verified using design data (for the system under design 300) input through the input unit 701 and the values of the signals (of the sequential circuit element group) extracted by the extracting unit 2503. Specifically, results of the calculation of the combinational circuits 401-1 to 401-*n* using the values extracted are acquired for one cycle at the clock specified.

The calculation results for the combinational circuits 401-1 to 401-*n* may be acquired by the execution of the simulation of the system under design 300 by the verification support apparatus 2500 or simulation results by a simulator may be acquired.

Further the output unit 707 outputs the verification results acquired by the acquiring unit 2504. Specifically, for example, the waveform of the specified signal X at the specified clock is displayed on the display 231. Hence, as the waveform of an arbitrary signal X can be provided, efficient debugging by the user is facilitated.

Verification support processing of the verification support apparatus 2500 according to the second embodiment is described. Design data conversion processing (the system under design 300→the system under design 1300) is identical to that described for the first embodiment and description thereof is omitted herein and in the figures. Here, verification support processing in which waveforms of the signal at an arbitrary clock are displayed as verification results is described.

Figure 27:
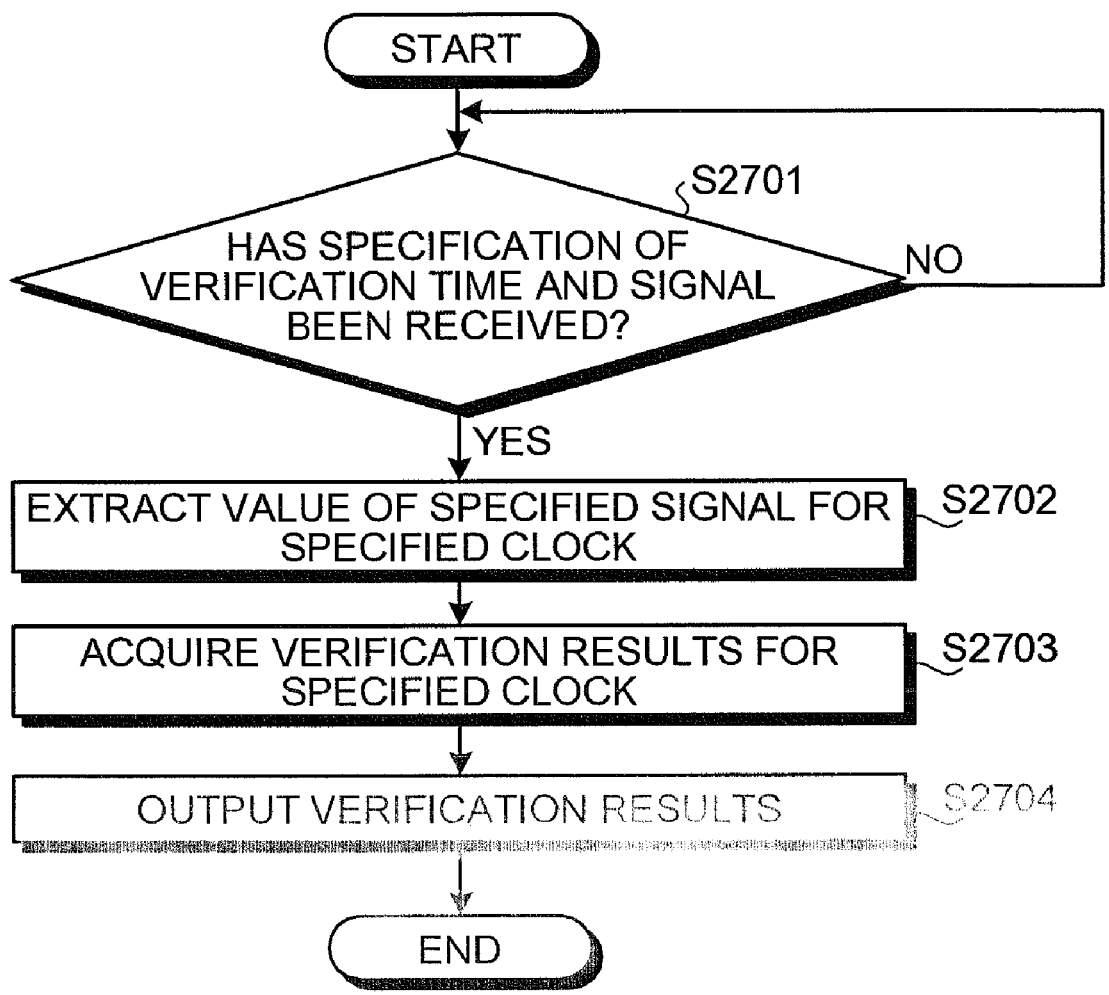
FIG. 27 is a flowchart of verification support processing performed by the verification support apparatus according to the second embodiment.

FIG. 27 is a flowchart of verification support processing performed by the verification support apparatus according to the second embodiment. As depicted in FIG. 27, the specifying unit 2502 determines whether specification of an arbitrary verification time within the verification period of the system under design 1300 having the single module 1301 and specification of an arbitrary signal among the input signals have been received (step S2701).

Specification of the arbitrary time (hereinafter, specified clock) and of the signal (hereinafter, specified signal) is waited for (step S2701: NO). If specification is received (step S2701: YES), the extracting unit 2503 extracts, from the storage table 2600, values of the specified signal of the sequential circuit element group at the specified clock (step S2702).

Subsequently, the acquiring unit 2504 acquires verification results of the system under design 1300 corresponding to the specified clock, the system under design 1300 being verified using design data of the system under design 300 and the values (of the specified signal of the sequential circuit element group) extracted by the extracting unit 2503. (step S2703).

The output unit 707 outputs the verification results acquired by the acquiring unit 2504 (step S2704), thereby ending a series of the processing depicted in the flowchart.

Thus, according to the second embodiment, values of the signals output from the sequential circuit elements (for example, FF 421-1 to 421-*n*) during verification of the system under design 1300 are stored respectively in the storage table 2600. Using the contents of the storage table 2600, values of the combinational circuits 401-1 to 401-*n* at the specified clock are obtained. Hence, the waveform of the specified signal at the specified clock can be provided as verification results of the system under design 1300 and efficient debugging by the user, when a bug is found, can be facilitated.

Further, as the values of the combination circuits 401-1 to 401-*n* can be recalculated using the contents of the storage table 2600, storage of the output values of the combination circuits 401-1 to 401-*n* is not necessary, thereby enabling a reduction in the volume of data to be stored in the memory unit. Although the recalculation takes time, the calculation is for a few cycles and hence, accounts for only a small portion of the verification work overall.

According to the first embodiment, waveforms of each of the signals of the (pre-conversion) system under design 300 are generated using the correlation table 1400. However, according to a third embodiment, with respect to a signal specified in advance, at the time of circuit conversion, a partial circuit is created that outputs values reflecting the values of the (pre-conversion) system under design 300. Hereinafter, only points differing from the first embodiment are described. Components identical to those of the first embodiment are given identical reference numerals and description thereof is omitted.

According to the third embodiment, before verification, specification of an arbitrary signal (hereinafter, specified signal) among input signals input to the system under design 300 is received. Specifically, for example, specification is received through user-operation of the keyboard 221, the mouse 222, etc. of the input apparatus 220 depicted in FIG. 2.

During verification of the (post-conversion) system under design 1300, a partial circuit is created that outputs, for each of the CPUs 301-1 to 301-*n*, values that are of the specified signal output from the sequential circuit element group (for example, FF 421-1 to 421-*n*) and result from the time-division operation by the control circuit 900. The system under design 1300 including the partial circuit added thereto is verified.

Figure 28:
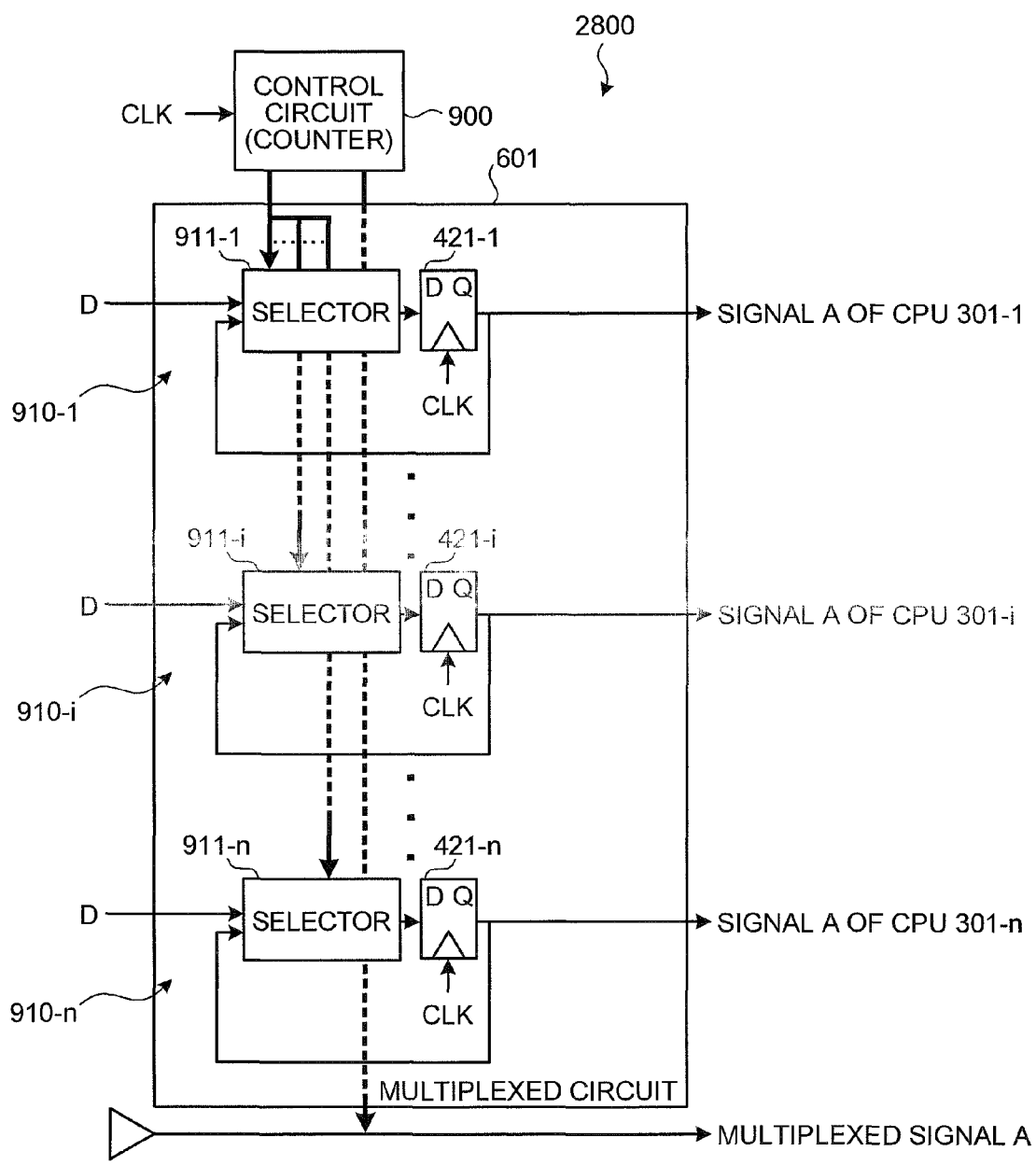
FIG. 28 is a schematic of an example of a partial circuit.

FIG. 28 is a schematic of an example of a partial circuit. As depicted in FIG. 28, a partial circuit 2800 is a circuit that outputs, for each of the CPUs 301-1 to 301-*n*, values of a signal A output from the sequential circuit element group (here, FF 421-1 to 421-*n*) during verification of the system under design 1300. By adding the partial circuit 2800 to the system under design 1300, waveforms of the specified signal (here, the signal A) can be output. The partial circuit 2800 is expressed by HDL description text data.

Thus, according to the third embodiment, through the addition of the partial circuit 2800 that outputs values of the specified signal, waveforms of an arbitrary signal A can be provided as verification results of the system under design 1300 and efficient debugging can be facilitated. Through the addition of the partial circuit 2800, the scale of the circuit increases; however, by the conversion of the system under design 300, the circuit volume is reduced and hence, the circuit scale becomes smaller overall.

As described above, according to aspects of the embodiments, the circuit scale of a system under design can be reduced and simulation using an FPGA can be executed. Therefore, a reduction in the simulation time can be facilitated.

Further, as the large circuit-scale multiplex module and the small circuit-scale single module are equivalent, the creation of a conventional pseudo processor is not necessary and a reduction in the workload of a designer can be facilitated. Additionally, as the multiplex module and the single module are equivalent, the use of a conventional pseudo processor is not necessary, thereby realizing fast and thorough simulation.

In addition, as waveforms of an arbitrary signal can be provided for each module as verification results for a system under design, time and labor for debugging can be reduced.

According aspects of the embodiments described above, through faster simulation of a system under design having a multiplex module and through more efficient debugging, shorter design periods can be realized.

The verification support method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The verification support apparatus 200, 2500 described in the present embodiments can be realized by an application specific integrated circuit (ASIC) such as a standard cell or a structured ASIC or a programmable logic device (PLD) such as a field-programmable gate array (FPGA). Specifically, for example, the functions of the units 701 to 709 of the verification support apparatus 200, 2500 are defined in HDL, which is logically synthesized and applied to the ASIC, the PLD, etc., thereby enabling manufacture of the verification support apparatus 200, 2500.

A recording medium storing therein design data for the system under design 1300 described may be prepared. Here, the design data for the system under design 1300 is computer-readable electronic data that is expressed in register transfer level (RTL) description described in HDL or by a netlist post logical synthesis. Such design data is expanded by a computer apparatus having a test tool installed therein, thereby enabling execution of a delay test before manufacture. Further, by enabling writing of the design data to PLD such as an FPGA and downloading the PLD, the system under design 1300 can be manufactured.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium storing therein a verification support program that causes a computer to execute:
   receiving input of design data concerning a system under design having a multiplex module that is a plurality of modules of an identical category and type operating in parallel;
   substituting, based on the design data, a multiplexed circuit for a plurality of sequential circuits in the modules, the multiplexed circuit being formed by a group of sequential circuit elements that are common among the sequential circuits and are multiplexed;
   creating a control circuit that time-division operates the group of common sequential circuit elements multiplexed by substitution of the sequential circuits at the substituting;
   building, based on the design data, a single module that includes one combinational circuit selected from among a plurality of combinational circuits of the modules, the multiplexed circuit, and the control circuit;
   generating information correlating timing of time-division operation of the group of sequential circuit elements with the modules having the sequential circuit elements operated at respective timings; and
   outputting the information generated at the generating and design data of the system inclusive of the single module.

2. The non-transitory computer-readable recording medium according to claim 1, the verification support program further causing a computer to execute:
   acquiring verification results of the system inclusive of the single module; and
   extracting, using the information generated at the generating of information, verification results for each of the modules from the verification results acquired at the acquiring, wherein the outputting includes outputting, for each of the modules, the verification results extracted at the extracting.

3. The non-transitory computer-readable recording medium according to claim 1, the verification support program further causing a computer to execute:
   substituting a group of input pins respectively disposed in the modules with an input I/F that selectively inputs, to the one combinational circuit, input to the modules; and
   substituting a group of output pins respectively disposed in the modules with an output I/F that selectively outputs an output from the one combinational circuit to the modules, wherein
   the creating includes creating the control circuit to further time-division control the input I/F and the output I/F, and
   the building includes building the single module further to include the input I/F and the output I/F.

4. A non-transitory computer-readable recording medium storing therein a verification support program that causes a computer to execute:
   receiving input of design data concerning a system under design having a multiplex module that is a plurality of modules of an identical category and type operating in parallel;
   substituting, based on the design data, a multiplexed circuit for a plurality of sequential circuits in the modules, the multiplexed circuit being formed by a group of sequential circuit elements that are common among the sequential circuits and are multiplexed;
   creating a control circuit that time-division operates the group of common sequential circuit elements multiplexed by substitution of the sequential circuits at the substituting;
   building, based on the design data, a single module that includes one combinational circuit selected from among a plurality of combinational circuits of the modules, the multiplexed circuit, and the control circuit; and
   storing, respectively for each of the sequential circuit elements, a value of a signal output from a sequential circuit element and resulting from the time-division operation of the sequential circuit elements by the control circuit, during verification of the system inclusive of the single module.

5. The non-transitory computer-readable recording medium according to claim 4, the verification support program further causing a computer to execute:
   receiving specification of an arbitrary verification time that is within a verification period of the system inclusive of the single module;
   extracting, from among storage results stored at the storing, the value of the signal of the group of sequential circuit elements at the arbitrary verification time specified; and acquiring verification results for the system inclusive of the single module and verified using the design data and the value of the signal extracted at the extracting.

6. The non-transitory computer-readable recording medium according to claim 4, the verification support program further causing a computer to execute:
substituting a group of input pins respectively disposed in the modules with an input I/F that selectively inputs, to the one combinational circuit, input to the modules; and
substituting a group of output pins respectively disposed in the modules with an output I/F that selectively outputs an output from the one combinational circuit to the modules, wherein
the creating includes creating the control circuit to further time-division control the input I/F and the output I/F, and
the building includes building the single module further to include the input I/F and the output I/F.

7. A non-transitory computer-readable recording medium storing therein a verification support program that causes a computer to execute:
receiving input of design data concerning a system under design having a multiplex module that is a plurality of modules of an identical category and type operating in parallel;
substituting, based on the design data, a multiplexed circuit for a plurality of sequential circuits in the modules, the multiplexed circuit being formed by a group of sequential circuit elements that are common among the sequential circuits and are multiplexed;
creating a control circuit that time-division operates the group of common sequential circuit elements multiplexed by substitution of the sequential circuits at the substituting;
receiving specification of an arbitrary signal among a plurality of signals input to the system under design;
creating a partial circuit outputting, for each of the modules, a value of the signal specified, output from and resulting from time-division operation of the group of sequential circuit elements by the control circuit;
building a single module that includes one combinational circuit selected from among a plurality of combinational circuits of the modules, the multiplexed circuit, the control circuit, and the partial circuit; and
outputting design data concerning the system inclusive of the single module.

8. The non-transitory computer-readable recording medium according to claim 7, the verification support program further causing a computer to execute:
substituting a group of input pins respectively disposed in the modules with an input I/F that selectively inputs, to the one combinational circuit, input to the modules; and
substituting a group of output pins respectively disposed in the modules with an output I/F that selectively outputs an output from the one combinational circuit to the modules, wherein
the creating includes creating the control circuit to further time-division control the input I/F and the output I/F, and
the building includes building the single module further to include the input I/F and the output I/F.

9. A verification support apparatus comprising:
a receiving unit configured to receive input of design data concerning a system under design having a multiplex module that is a plurality of modules of an identical category and type operating in parallel;
a substituting unit configured to substitute, based on the design data, a multiplexed circuit for a plurality of sequential circuits in the modules, the multiplexed circuit being formed by a group of sequential circuit elements that are common among the sequential circuits and are multiplexed;
a creating unit configured to create a control circuit that time-division operates the group of common sequential circuit elements multiplexed by substitution of the sequential circuits at the substituting;
a building unit configured to build, based on the design data, a single module that includes one combinational circuit selected from among a plurality of combinational circuits of the modules, the multiplexed circuit, and the control circuit;
generating information correlating timing of time-division operation of the group of sequential circuit elements with the modules having the sequential circuit elements operated at respective timings; and
an outputting unit configured to output the information generated at the generating and design data of the system inclusive of the single module.

10. A verification support apparatus comprising:
a receiving unit configured to receive input of design data concerning a system under design having a multiplex module that is a plurality of modules of an identical category and type operating in parallel;
a substituting unit configured to substitute, based on the design data, a multiplexed circuit for a plurality of sequential circuits in the modules, the multiplexed circuit being formed by a group of sequential circuit elements that are common among the sequential circuits and are multiplexed;
a creating unit configured to create a control circuit that time-division operates the group of common sequential circuit elements multiplexed by substitution of the sequential circuits at the substituting;
a building unit configured to build, based on the design data, a single module that includes one combinational circuit selected from among a plurality of combinational circuits of the modules, the multiplexed circuit, and the control circuit;
generating information correlating timing of time-division operation of the group of sequential circuit elements with the modules having the sequential circuit elements operated at respective timings; and
a storing unit configured to store, respectively for each of the sequential circuit elements, a value of a signal output from a sequential circuit element and resulting from the time-division operation of the sequential circuit elements by the control circuit, during verification of the system inclusive of the single module.

11. A verification support apparatus comprising:
a receiving unit configured to receive input of design data concerning a system under design having a multiplex module that is a plurality of modules of an identical category and type operating in parallel;
a substituting unit configured to substitute, based on the design data, a multiplexed circuit for a plurality of sequential circuits in the modules, the multiplexed circuit being formed by a group of sequential circuit elements that are common among the sequential circuits and are multiplexed;
a creating unit configured to create a control circuit that time-division operates the group of common sequential circuit elements multiplexed by substitution of the sequential circuits at the substituting;
a receiving unit configured to receive specification of an arbitrary signal among a plurality of signals input to the system under design;

a creating unit configured to create a partial circuit outputting, for each of the modules, a value of the signal specified, output from and resulting from time-division operation of the group of sequential circuit elements by the control circuit;

a building unit configured to build a single module that includes one combinational circuit selected from among a plurality of combinational circuits of the modules, the multiplexed circuit, the control circuit, and the partial circuit; and an outputting unit configured to output design data concerning the system inclusive of the single module.

* * * * *